United States Patent
Kim et al.

(10) Patent No.: US 8,742,402 B2
(45) Date of Patent: Jun. 3, 2014

(54) ORGANIC LIGHT-EMITTING DEVICE HAVING A CYANO COMPOUND

(75) Inventors: Tae-Shick Kim, Yongin (KR);
Dong-Heon Kim, Yongin (KR);
Kwan-Hee Lee, Yongin (KR);
Kyung-Hoon Choi, Yongin (KR);
Mie-Hwa Park, Yongin (KR)

(73) Assignee: Samsung Display Co., Ltd., Yongin, Gyeonngi-Do (KR)

( * ) Notice: Subject to any disclaimer, the term of this patent is extended or adjusted under 35 U.S.C. 154(b) by 1 day.

(21) Appl. No.: 12/895,439

(22) Filed: Sep. 30, 2010

(65) Prior Publication Data
US 2011/0084255 A1    Apr. 14, 2011

(30) Foreign Application Priority Data
Oct. 12, 2009 (KR) .................. 10-2009-0096821

(51) Int. Cl.
*H01L 29/08* (2006.01)

(52) U.S. Cl.
USPC ............... 257/40; 257/103; 257/E51.027

(58) Field of Classification Search
CPC ............ H01L 51/0051; H01L 51/5206; H01L 51/0058; H01L 51/006; H01L 51/0079; H01L 51/0081; H01L 2251/305; H01L 51/30
USPC .................... 257/40, 103, E51.027
See application file for complete search history.

(56) References Cited

U.S. PATENT DOCUMENTS

| | | | | |
|---|---|---|---|---|
| 3,681,353 A | * | 8/1972 | Martin | 544/347 |
| 4,720,432 A | * | 1/1988 | VanSlyke et al. | 428/457 |
| 5,061,569 A | * | 10/1991 | VanSlyke et al. | 428/457 |
| 5,089,248 A | * | 2/1992 | Akhtar | 423/604 |
| 5,804,322 A | | 9/1998 | Shi et al. | |
| 6,908,783 B1 | * | 6/2005 | Kuehl et al. | 438/99 |
| 7,279,705 B2 | * | 10/2007 | Iou | 257/40 |
| 2005/0173700 A1 | * | 8/2005 | Liao et al. | 257/40 |
| 2005/0244645 A1 | * | 11/2005 | Ionkin et al. | 428/411.1 |
| 2005/0284514 A1 | * | 12/2005 | Brabec | 136/243 |
| 2009/0004490 A1 | | 1/2009 | Gotou et al. | |
| 2009/0015150 A1 | | 1/2009 | Kang et al. | |
| 2009/0200913 A1 | | 8/2009 | Kim et al. | |
| 2010/0072884 A1 | * | 3/2010 | Tchakarov et al. | 313/504 |
| 2011/0233525 A1 | | 9/2011 | Terao et al. | |

FOREIGN PATENT DOCUMENTS

| | | |
|---|---|---|
| JP | 09-148073 A | 6/1997 |
| JP | 2002-216970 A | 8/2002 |
| JP | 2004-002740 | 1/2004 |

(Continued)

OTHER PUBLICATIONS

Nazario Martin et al., Design and synthesis of TCNQ and DCNQI type electron acceptor molecules as precursors for 'organic metals', Journal Article, Jan. 1, 1997, 1661-1676, vol. 7-issue 9, J. Mater. Chem., Madrid, Spain.

(Continued)

*Primary Examiner* — Kimberly Rizkallah
*Assistant Examiner* — Caleb Henry
(74) *Attorney, Agent, or Firm* — Knobbe, Martens, Olson & Bear, LLP

(57) ABSTRACT

An organic light-emitting device including a first electrode and a first layer, wherein the first electrode includes a first element-containing zinc oxide layer and the first layer includes a cyano group-containing compound.

16 Claims, 1 Drawing Sheet

(56) References Cited

FOREIGN PATENT DOCUMENTS

| | | | |
|---|---|---|---|
| JP | 2006140180 A | * | 6/2006 |
| KR | 10-2005-0054427 A | | 6/2005 |
| KR | 10-2007-004308 A | | 4/2007 |
| KR | 100730190 B1 | | 6/2007 |
| KR | 10-2008-0052594 A | | 6/2008 |
| KR | 10-2008-0114575 A | | 12/2008 |
| KR | 10-2009-0035729 A | | 4/2009 |
| KR | 10-2009-0087692 | | 8/2009 |
| WO | WO 2009/069434 A1 | | 6/2009 |

OTHER PUBLICATIONS

Official Action issued by the Korean Industrial Property Office issued Apr. 11, 2011 in Korean Patent Application No. 10-2009-0096821.
Extended European Search Report issued by the European Patent Office in the examination of European Patent Application No. 10251784.4 dated Aug. 7, 2012, 19 pages.
Reginald H. Mitchell, Xin Jin, Tetsuo Otsubo and Kazuo Takimiya, An annulene TCNQ derivative with rather weak acceptor properties, 1997, pp. 611-615, vol. 75, Can. J. Chem, nrcresearchpress.com.
Macrae Maxfield, Steven M. Willis, Dwaine O. Cowan, Aaron N. Bloch and Theodore O. Poehler, Synthesis of 13,13,14,14-tetracyanopyreno-2,7-quinodimethane, an Electron Acceptor for Organic Metals, Journal, 1980, pp. 947-948, J.C.S. Chem. Comm.
Shunro Yamaguchi, Katsushi Nagareda and Terukiyo Hanafusa, Synthesis of 1,2,3,6,7,8-Hexahydro-10,10,11,11-Tetracyano-4,9-Pyrenoquinodimethane, 1989, pp. 401-402, vol. 30, Synthetic Metals, Elsevier Sequoia, The Netherlands.
M.L. Kaplan, R.C. Haddon, F.B. Bramwell, F. Wudl, J.H. Marshall, D.O. Cowan, and S. Gronowitz, Cyano-Based Acceptor Molecules, Electrochemistry and Electron Spin Resonance Spectroscopy, 1980, pp. 427-431, vol. 84, No. 4, American Chemical Society.
Helmut Vogler and Michael C. Böhm, The electronic structures of some extended conjugated electron acceptors within the Hartree-Fock approximation and beyond the mean-field approach as verified by the Hartree-Fock instabilities, 1984, pp. 51-64, vol. 66, Theoret. Chim. Acta.
Partial European Search Report issued by the European Patent Office dated Apr. 26, 2012 in European Patent Application No. 10251784.4, 10 pages.
Gunzi Saito, Shuichi Sekizaki, Akihiko Konsha, Hideki Yamochi, Kiyoshi Matsumoto, Masami Kusonoki and Ken-Ichi Sakaguchi, A Stable and flexible dianion: 2-dicyanomethylene-1, 3, 4, 5, 5-hexacyanopentenediide ($DHCP^{2-}$), and its complex formation†, Journal, 2001, pp. 364-373, vol. 11, Journal of Materials Chemistry.
Examination Report issued by the European Patent Office on Jun. 14, 2013 in the examination of the European Patent Application No. 10 251 784.4, which corresponds to the captioned U.S. Appl. No. 12/895,439.

* cited by examiner

ORGANIC LIGHT-EMITTING DEVICE HAVING A CYANO COMPOUND

CROSS-REFERENCE TO RELATED APPLICATIONS

This application claims the benefit of Korean Patent Application No. 10-2009-0096821, filed on Oct. 12, 2009, in the Korean Intellectual Property Office, the disclosure of which is incorporated herein in its entirety by reference.

BACKGROUND

1. Field

The present embodiments relate to an organic light-emitting device including a zinc oxide layer containing an element such as aluminum (Al), and a cyano group-containing compound.

2. Description of the Related Technology

Organic light-emitting devices (OLEDs), which are self-emitting devices, have advantages such as a wide viewing angle, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied to the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

The present embodiments provide an organic light-emitting device (OLED) having excellent driving voltage characteristics, emission efficiency characteristics, and power efficiency characteristics.

According to an aspect of the present embodiments, there is provided an organic light-emitting device comprising: a substrate; a first electrode disposed on the substrate; a second electrode; an organic layer disposed between the first electrode and the second electrode, the organic layer comprising an emission layer; and at least one first layer disposed between the first electrode and the emission layer, the at least one first layer comprising a cyano group-containing compound, wherein the first electrode comprises a first element-containing zinc oxide layer, wherein the first element in the first element-containing zinc oxide layer comprises at least one element selected from the group consisting of aluminum (Al), indium (In), gallium (Ga), germanium (Ge), gadolinium (Gd), zirconium (Zr), molybdenum (Mo), and nickel (Ni).

The first electrode further may include a transparent conductive layer.

The first element may include aluminum (Al).

Regarding the cyano group-containing compound in the organic light-emitting device, a detailed description section of the specification, which will be provided below, should be referred to.

The first layer of the organic light-emitting device may further include a hole transporting compound. Regarding the hole transporting compound, the detailed descriptions of the specification, which will be provided below, should be referred to.

The first layer may have a thickness of about 10 Å to about 2,100 Å.

A distance between the first layer and the emission layer may be 50 Å or greater.

The organic light-emitting device may further include at least one layer selected from the group consisting of a hole injection layer and a hole transport layer between the first layer and the emission layer.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

Figure 1:
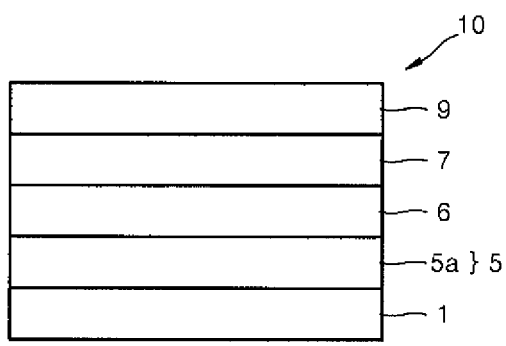
FIG. 1 is a cross-sectional view illustrating a structure of an organic light-emitting device (OLED) according to an embodiment.

FIG. 1 is a schematic sectional view of an organic light-emitting device (OLED) 10 according to an embodiment. Referring to FIG. 1, the OLED 10 according to the present embodiment includes a substrate 1, a first electrode 5, a first layer 6 including a cyano group-containing compound, an organic layer 7, and a second electrode 9, which are sequentially stacked in this order. The first electrode 5 includes a zinc oxide layer 5a containing a first element.

The substrate 1, which may be any substrate that is used in conventional organic light-emitting devices, may be, for example, a glass substrate or a transparent plastic substrate with excellent mechanical strength, thermal stability, transparency, surface smoothness, ease of handling, and waterproofness.

The first element-containing zinc oxide layer 5a is disposed on the substrate 1. The first element in the first element-containing zinc oxide layer 5a may include at least one element selected from the group consisting of aluminum (Al), indium (In), gallium (Ga), germanium (Ge), gadolinium (Gd), zirconium (Zr), molybdenum (Mo), and nickel (Ni).

The first element may include aluminum (Al), but is not limited thereto.

The first element-containing zinc oxide layer 5a lowers the hole injection barrier by increasing the work function of the first electrode 5, and thus facilitates the injection of holes into the organic layer 7 from the first electrode 5.

The amount of the first element in the first element-containing zinc oxide layer 5a may be from about 0.1 to about 10 parts by weight based on 100 parts by weight of the first element-containing zinc oxide layer 5a. For example, the amount of the first element may be from about 0.5 to about 5 parts by weight based on 100 parts by weight of the first element-containing zinc oxide layer 5a, but is not limited thereto. When the amount of the first element in the first element-containing zinc oxide layer 5a is within the above ranges, the first element-containing zinc oxide layer 5a may have excellent hole transporting ability without a substantial increase in electrical resistance or a substantial reduction in the transmittance of visible light.

The first element-containing zinc oxide layer 5a may have a thickness of from about 1 Å to about 800 Å, for example, the thickness may be from about 10 Å to about 500 Å. When the thickness of the first element-containing zinc oxide layer 5a is within the above ranges, excellent efficiency characteristics may be attained without a substantial reduction in driving voltage.

The first layer 6 including a cyano group-containing compound is disposed on the first element-containing zinc oxide layer 5a. The first layer 6 may include at least one layer. The cyano group-containing compound included in the first layer 6 has two one-electron reduced forms, and may have an extended π-electron system capable of generating stable radicals (This can be identified by, for example, cyclic voltammetry). The first layer 6 lowers the barrier of hole injection from the first electrode 5 into the organic layer 7, and thus, facilitates the injection of holes into the organic layer 7 from the first electrode 5. Thus, the OLED 10 may have excellent driving voltage characteristics and power efficiency characteristics.

The cyano group-containing compound included in the first layer 6 may be one of the compounds represented by Formulae 1 through 20 below.

Formula 1

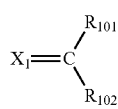

Formula 2

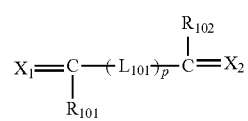

Formula 3

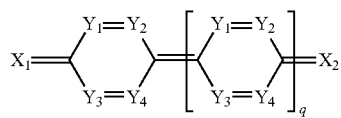

Formula 4

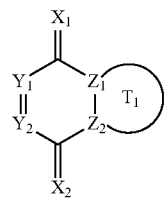

Formula 5

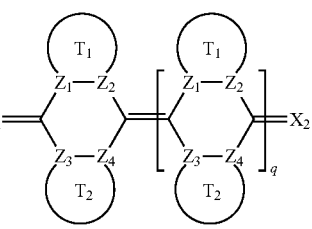

Formula 6

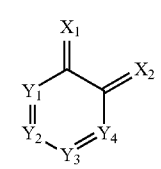

Formula 7

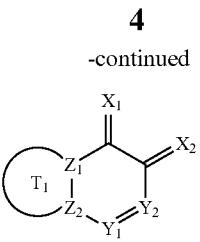

Formula 8

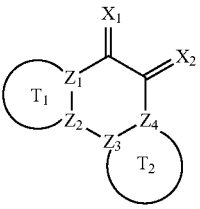

Formula 9

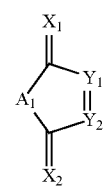

Formula 10

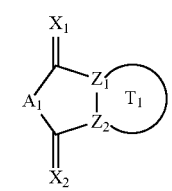

Formula 11

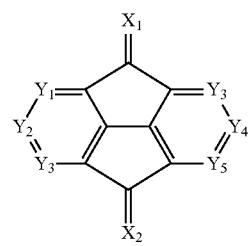

Formula 12

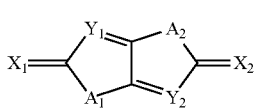

Formula 13

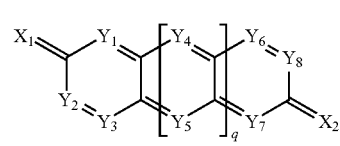

Formula 14

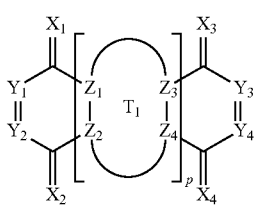

Formula 15
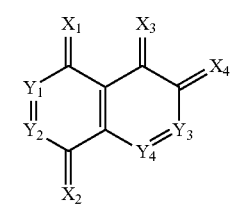

Formula 16
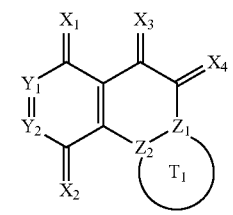

Formula 17
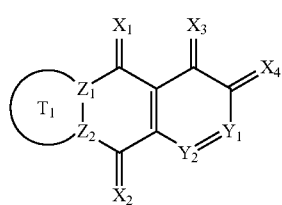

Formula 18
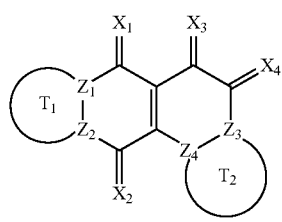

Formula 19
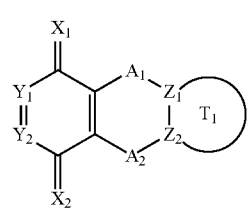

Formula 20
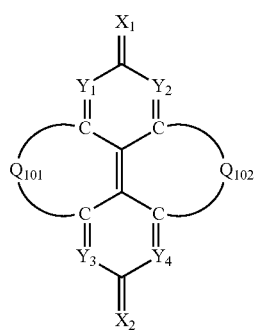

In Formulae 1 through 20, $X_1$ through $X_4$ may be each independently selected from the group consisting of compounds represented by Formulae 30A through 30D below;

Formula 30A
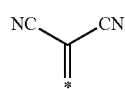

Formula 30B
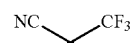

Formula 30C
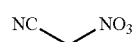

Formula 30D
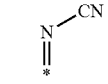

$Y_1$ through $Y_8$ may be each independently N or $C(R_{103})$; $Z_1$ through $Z_4$ may be each independently C or N; $A_1$ and $A_2$ may be each independently selected from the group consisting of —O—, —S—, —N($R_{104}$)— and —C($R_{105}$)($R_{106}$)—; $Q_{101}$ and $Q_{102}$ may be each independently selected from the group consisting of a $C_2$-$C_{10}$ alkylene group, a $C_2$-$C_{10}$ alkenylene group, and a substituted $C_2$-$C_{10}$ alkylene group and a substituted $C_2$-$C_{10}$ alkenylene group which have at least one substituent selected from the group consisting of a halogen atom, a cyano group, a hydroxyl group, a $C_1$-$C_{10}$ alkyl group and a $C_1$-$C_{10}$ alkoxy group; $T_1$ and $T_2$ may be each independently selected from the group consisting of a $C_5$-$C_{30}$ aromatic ring system, a $C_3$-$C_{30}$ heteroaromatic ring system, and a substituted $C_5$-$C_{30}$ aromatic ring system and a substituted $C_3$-$C_{30}$ heteroaromatic ring system which have at least one substituent selected from the group consisting of a halogen atom, a cyano group, a hydroxyl group, a $C_1$-$C_{10}$ alkyl group and a $C_1$-$C_{10}$ alkoxy group; p may be an integer from 1 to 10; q may be an integer from 0 to 10; $R_{101}$ through $R_{106}$ may be each independently selected from the group consisting of hydrogen, a halogen atom, a cyano group, a hydroxyl group, a $C_1$-$C_{10}$ alkyl group, a $C_1$-$C_{10}$ alkoxy group, a substituted $C_1$-$C_{10}$ alkyl group and a substituted $C_1$-$C_{10}$ alkoxy group which has at least one substituent selected from the group consisting of hydrogen, a halogen atom, a cyano group, a hydroxyl group, a $C_5$-$C_{14}$ aryl group, and a $C_3$-$C_{14}$ heteroaryl group, and —N($R_{107}$)($R_{108}$), wherein $R_{107}$ and $R_{108}$ are each independently selected from the group consisting of hydrogen, a $C_1$-$C_{10}$ alkyl group, a phenyl group, and a biphenyl group; and $L_{101}$ may be selected from the group consisting of a $C_2$-$C_{10}$ alkenylene group, $C_5$-$C_{14}$ arylene group, a $C_3$-$C_{14}$ heteroarylene group, and a substituted $C_2$-$C_{10}$ alkenylene group, a substituted $C_5$-$C_{14}$ arylene group and a substituted $C_3$-$C_{14}$ heteroarylene group which have at least one substituent selected from the group consisting of a halogen atom, a cyano group, a hydroxyl group, a $C_1$-$C_{10}$ alkyl group, and a $C_1$-$C_{10}$ alkoxy group.

For example, in Formula 1 through 20, $X_1$ through $X_4$ may be each independently a compound of Formula 30A or a compound of Formula 30D.

For example, $R_{103}$ in $C(R_{103})$ for $Y_1$ through $Y_8$ in Formulae 1 through 20 may be selected from the group consisting of hydrogen; a halogen atom; a cyano group; a $C_1$-$C_{10}$ alkyl group; a $C_1$-$C_{10}$ alkoxy group; a substituted $C_1$-$C_{10}$ alkyl group and a substituted $C_1$-$C_{10}$ alkoxy group which have at least one substituent selected from the group consisting of a halogen atom, a cyano group, a phenyl group, a naphthyl group, an anthryl group, a pyridinyl group, a thiophenyl group, and a benzothiophenyl group; and —N($R_{107}$)($R_{108}$), wherein $R_{107}$ and $R_{108}$ may be each independently selected from the group consisting of hydrogen, a $C_1$-$C_{10}$ alkyl group, a phenyl group, and a biphenyl group.

$R_{103}$ may be selected from the group consisting of hydrogen, —F, a cyano group, a methyl group, an ethyl group, a propyl group, an ethenyl group, a methoxy group, an ethoxy group, a propoxy group, a phenyl-substituted methyl group, a phenyl-substituted propyl group, and —N(biphenyl group)(biphenyl group), but is not limited thereto.

In Formulae 1 and 2, $R_{101}$ and $R_{102}$ may be each independently selected from the group consisting of a cyano group,

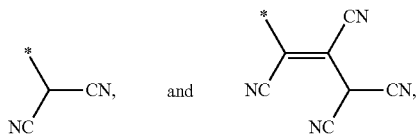 [SMILES: *C(C#N)C#N ; "and" ; */C(C#N)=C(\C#N)C(C#N)C#N]

but are not limited thereto.

In Formulae 1 through 20, $A_1$ and $A_2$ may be —S—, but are not limited thereto.

In Formula 20, $Q_{101}$ and $Q_{102}$ may be each independently selected from the group consisting of an ethylene group, a propylene group, an ethenylene group, a propenylene group, and a substituted ethylene group, a substituted propylene group, a substituted ethenylene group and a substituted propenylene group which have at least one substituent selected from the group consisting of a halogen atom, a cyano group and a hydroxyl group. $Q_{101}$ and $Q_{102}$ may be each independently selected from the group consisting of an ethylene group, an ethenylene group, and a substituted ethylene group and a substituted ethenylene group which have at least one substituent selected from the group consisting of —F and a cyano group, but are not limited thereto.

In Formulae 1 through 20, $T_1$ and $T_2$ may be each independently selected from the group consisting of a $C_5$-$C_{30}$ aromatic ring system including elements $Z_1$ and $Z_2$, or $Z_3$ and $Z_4$; a $C_3$-$C_{30}$ heteroaromatic ring system; a substituted $C_5$-$C_{30}$ aromatic ring system having at least one substituent selected from the group consisting of a halogen atom, a cyano group, a hydroxyl group, a $C_1$-$C_{10}$ alkyl group and a $C_1$-$C_{10}$ alkoxy group; and a substituted $C_3$-$C_{30}$ heteroaromatic ring system having at least one substituent selected from the group consisting of a halogen atom, a cyano group, a hydroxyl group, a $C_1$-$C_{10}$ alkyl group and a $C_1$-$C_{10}$ alkoxy group. As identified from Formulae 1 through 20, $T_1$ and $T_2$ can be fused to the backbones of Formulae 1 through 20.

The $C_5$-$C_{30}$ aromatic ring system refers to a $C_5$-$C_{30}$ carbocyclic aromatic system including at least one aromatic ring. In this regard, the term "system" is used herein in order to indicate that the $C_5$-$C_{30}$ aromatic ring system may include a polycyclic structure. When the $C_5$-$C_{30}$ aromatic ring system includes 2 or more aromatic rings, the 2 or more aromatic rings may be fused together. The $C_3$-$C_{30}$ heteroaromatic ring system refers to a $C_3$-$C_{30}$ carbocyclic aromatic system including at least one heteroaromatic ring, wherein the at least one heteroaromatic ring includes at least one heteroatom selected from the group consisting of nitrogen (N), oxygen (O), phosphorous (P) and sulfur (S), and carbon (C) as the other ring atoms. When the $C_3$-$C_{30}$ heteroaromatic ring system further includes at least one of an aromatic ring and a heteroaromatic ring, two or more (hetero)aromatic rings may be fused together.

Examples of the $C_5$-$C_{30}$ aromatic ring system include benzene, pentalene, indene, naphthalene, azulene, heptalene, indacene, acenaphthylene, fluorene, phenalene, phenanthrene, anthracene, fluoranthene, triphenylene, pyrene, chrysene, naphthacene, picene, perylene, pentaphene, and hexacene, but are not limited thereto.

Examples of the $C_3$-$C_{30}$ heteroaromatic ring system include pyrrole, pyrazole, imidazole, imidazoline, pyridine, pyrazine, pyrimidine, indole, purine, quinoline, phthalazine, indolizine, naphthyridine, quinazoline, cinnoline, indazole, carbazole, phenazine, phenanthridine, pyran, chromene, benzofuran, thiophene, benzothiophene, isothiazole, isoxazole, thiadiazole, and oxadiazole, but are not limited thereto.

For example, in Formulae 1 through 20, $T_1$ and $T_2$ may be each independently selected from the group consisting of benzene; naphthalene; anthracene; thiophene; thiadiazole; oxadiazole; and a substituted benzene, a substituted naphthalene, a substituted anthracene, a substituted thiophene, a substituted thiadiazole and a substituted oxadiazole which have at least one substituent selected from the group consisting of a halogen atom, a cyano group, a $C_1$-$C_{10}$ alkyl group and a $C_1$-$C_{10}$ alkoxy group.

In Formulae 1 through 20, p may be 1, but is not limited thereto. In addition, q may be 0, 1, or 2, but is not limited thereto. For example, when q in Formula 3 is 0, the compound of Formula 3 may be a compound represented by Formula 3A, which will be described later.

In Formula 2, $L_{101}$ may be a $C_5$-$C_{14}$ arylene group; a $C_3$-$C_{14}$ heteroarylene group; a substituted $C_5$-$C_{14}$ arylene group having at least one substituent selected from the group consisting of a halogen atom, a cyano group, a hydroxyl group, a $C_1$-$C_{10}$ alkyl group and a $C_1$-$C_{10}$ alkoxy group; or a substituted $C_3$-$C_{14}$ heteroarylene group having at least one substituent selected from the group consisting of a halogen atom, a cyano group, a hydroxyl group, a $C_1$-$C_{10}$ alkyl group and a $C_1$-$C_{10}$ alkoxy group. For example, $L_{101}$ may be selected from the group consisting of a thiophenylene group; a benzothiophenylene group; and a substituted thiophenylene group and a substituted benzothiophenylene group which have at least one substituent selected from the group consisting of a halogen atom, a cyano group and a $C_1$-$C_{10}$ alkyl group.

The cyano group-containing compound included in the first layer 6 of the OLED 10 may be one of the compounds represented by Formulae 1A through 20B below, but is not limited thereto:

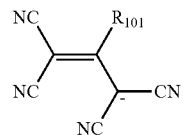

Formula 1A

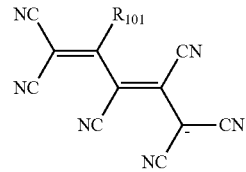

Formula 1B

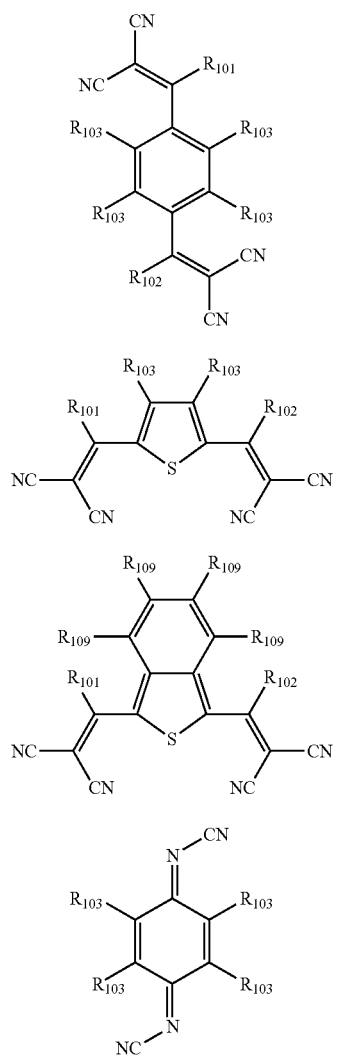
Formula 2A
Formula 2B
Formula 2C
Formula 3A
Formula 3B
Formula 3C
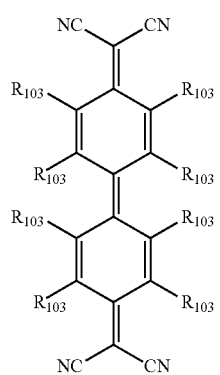
Formula 3D
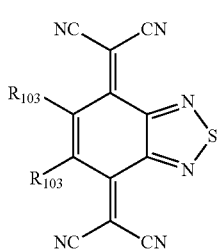
Formula 4A
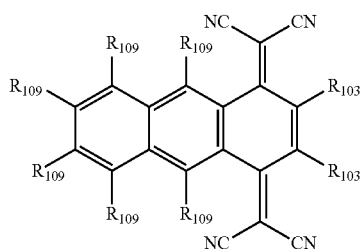
Formula 4B
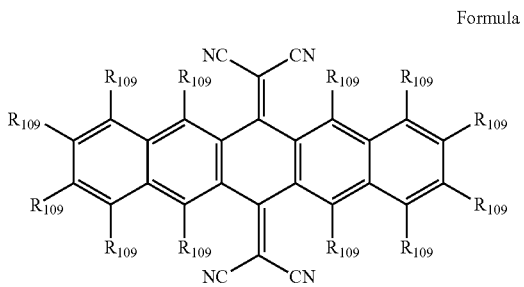
Formula 5A
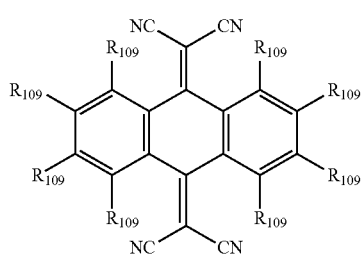
Formula 5B -continued
Formula 5C
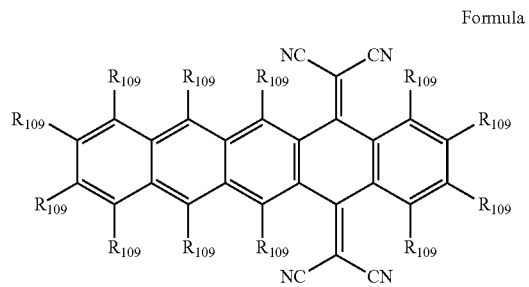
Formula 5D
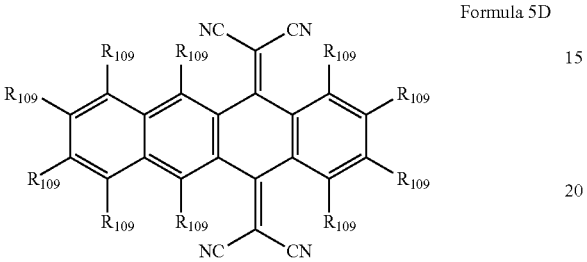
Formula 5E
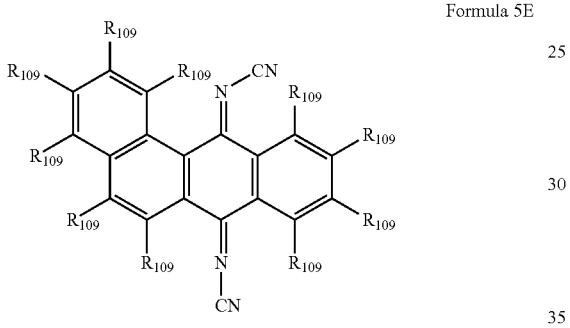
Formula 5F
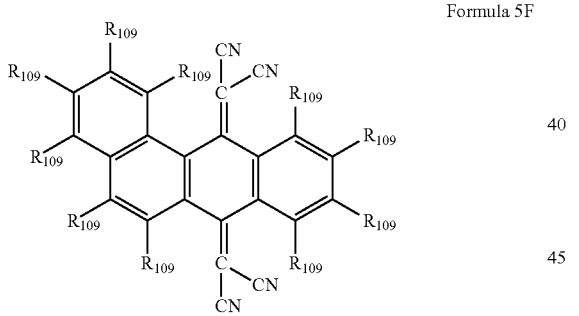
Formula 5G
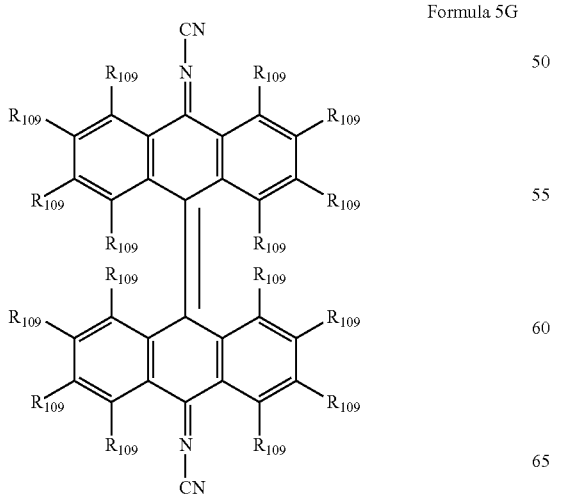
Formula 5H
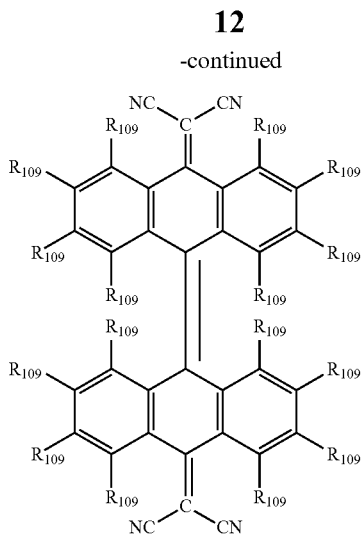
Formula 5I
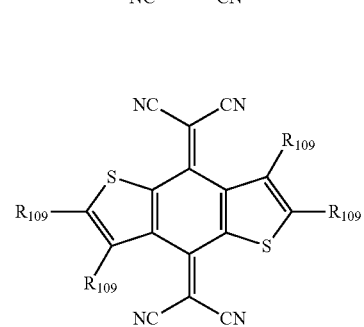
Formula 5J
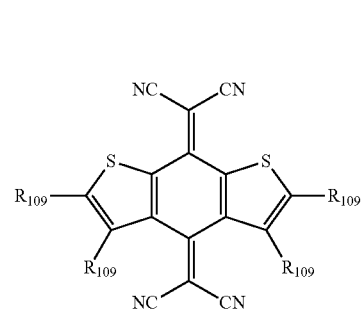
Formula 5K
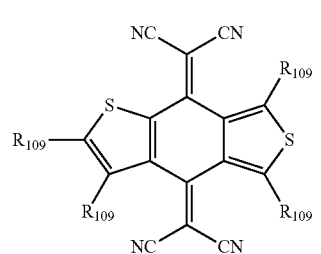
Formula 5L
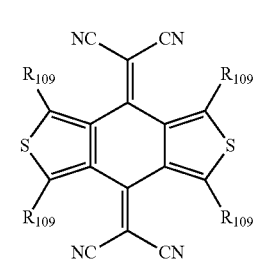

-continued

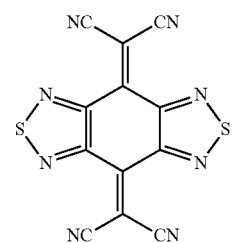
Formula 5M

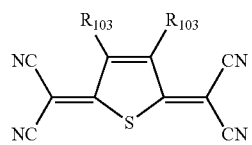
Formula 9A

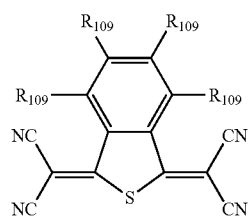
Formula 10A

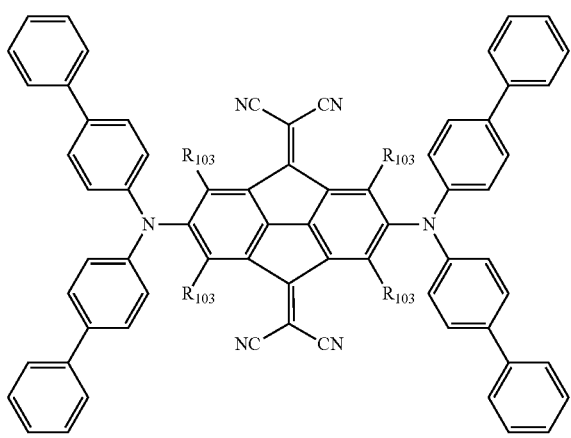
Formula 11A

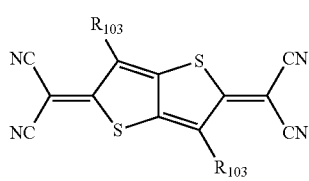
Formula 12A

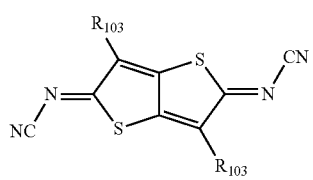
Formula 12B

-continued

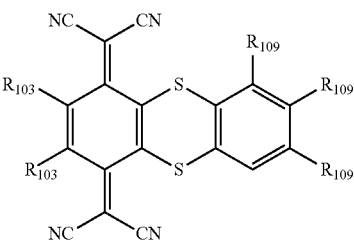
Formula 19A

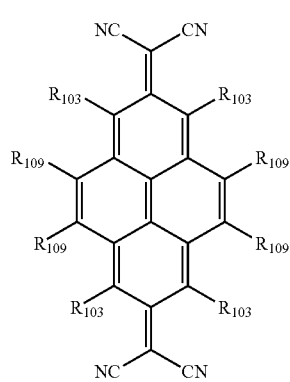
Formula 20A

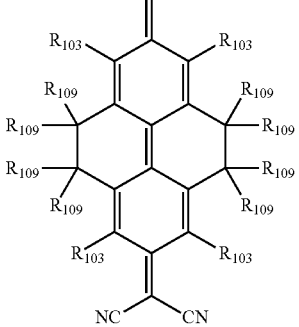
Formula 20B

In Formulae 1A through 20B, $R_{103}$ and $R_{109}$ may be each independently selected from the group consisting of hydrogen, fluorine, a cyano group, a methyl group, an ethyl group, a propyl group, a methoxy group, an ethoxy group, and a propoxy group.

For example, the cyano group-containing compound included in the first layer 6 of the OLED 10 may be the compound of Formula 20A or 20B. In Formulae 20A and 20B, $R_{103}$ and $R_{109}$ may be both fluorine.

The cyano group-containing compound included in the first layer 6 improves the hole injecting ability of the first element-containing zinc oxide layer 5A. Thus, the OLED 10 may have a reduced driving voltage and higher emission and power efficiencies.

The first layer 6 may further include a hole transporting compound, in addition to the cyano group-containing compound described above. The cyano group-containing compound forms a charge transfer complex with the hole transporting compound, so that the concentration of free carriers in the first layer 6 may be increased. Thus, the cyano group-containing compound may contribute to a reduction in interfacial resistance between the first electrode 5 and the organic layer 7.

The hole transporting compound may be any known compound.

Alternatively, the hole transporting compound may be one of the compounds represented by Formulae 41 and 42 below.

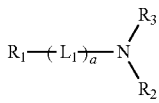
Formula 41

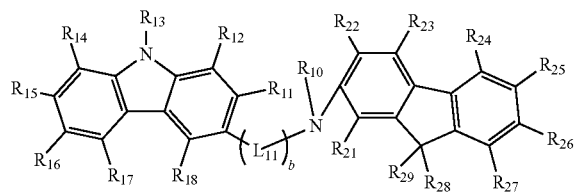
Formula 42

In Formulae 41 and 42, $R_{10}$ is represented by —$(Ar_1)_n$—$Ar_2$; $R_{16}$ is represented by —$(Ar_{11})_m$—$Ar_{12}$; $Ar_1$, $Ar_{11}$, $L_1$ and $L_{11}$ are each independently selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, and —$N(Q_1)$-; n, m, a and b are each independently an integer from 0 to 10; $R_1$ through $R_3$, $R_{11}$ through $R_{15}$, $R_{17}$, $R_{18}$, $R_{21}$ through $R_{29}$, $Ar_2$, $Ar_{12}$ and $Q_1$ are each independently selected from the group consisting of hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a $C_3$-$C_{30}$ heteroaryl group, and —$N(Q_2)(Q_3)$; and $Q_2$ and $Q_3$ are each independently hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, or a substituted or unsubstituted $C_3$-$C_{30}$ heteroaryl group, wherein groups of $Ar_1$ in —$(Ar_1)_n$— may be identical to or different from each other, groups of $Ar_{11}$ in —$(Ar_{11})_m$— may be identical to or different from each other, a groups of $L_1$ in -$L_1)_a$- may be identical to or different from each other, and groups of $L_{11}$ in -$(L_{11})_b$- may be identical to or different from each other.

Examples of $Ar_1$ in the formula —$(Ar_1)_n$—$Ar_2$— for $R_{10}$ and $Ar_{11}$ in the formula —$(Ar_{11})_m$—$Ar_{12}$— for $R_{16}$ are each independently selected from the group consisting of a substituted or unsubstituted $C_1$-$C_{10}$ alkylene group, a substituted or unsubstituted $C_2$-$C_{10}$ alkenylene group, a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted triazinylene group, and a group represented by —$N(Q_1)$-, but are limited thereto. In this regard, $Q_1$ may be selected from the group consisting of hydrogen, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_1$-$C_{10}$ alkylthiol group, a substituted or unsubstituted $C_5$-$C_{14}$ aryl group, a substituted or unsubstituted $C_3$-$C_{14}$ heteroaryl group, and —$N(Q_2)(Q_3)$, but is not limited thereto.

For example, $Ar_1$ and $Ar_{11}$ may be each independently selected from the group consisting of a $C_1$-$C_{10}$ alkylene group; a phenylene group; a naphthylene group; an anthrylene group; a fluorenylene group; a carbazolylene group; a pyrazolylene group; a pyridinylene group; a triazinylene group; —$N(Q_1)$-; and a substituted $C_1$-$C_{10}$ alkylene group, a substituted phenylene group, a substituted naphthylene group, a substituted anthrylene group, a substituted fluorenylene group, a substituted carbazolylene group, a substituted pyrazolylene group, a substituted pyridinylene group, and a substituted triazinylene group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group. In this regard, $Q_1$ may be selected from the group consisting of hydrogen; a $C_1$-$C_{10}$ alkyl group; a phenyl group; a naphthyl group; a carbazolyl group; a fluorenyl group; a pyrenyl group; a substituted $C_1$-$C_{10}$ alkyl group, a substituted $C_1$-$C_{10}$ alkoxy group, a substituted phenyl group, a substituted naphthyl group, a substituted carbazolyl group, a substituted fluorenyl group and a substituted pyrenyl group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group; and —N($Q_2$)($Q_3$), but is not limited thereto. In addition, $Q_2$ and $Q_3$ may be selected from the group consisting of a methyl group, a phenyl group, a naphthyl group, and an anthryl group.

$Ar_2$ in the formula —$(Ar_1)_n$—$Ar_2$— and $Ar_{12}$ in the formula —$(Ar_{11})_m$—$Ar_{12}$— are as defined above in connection with $Q_1$.

n in the formula —$(Ar_1)n$-$Ar_2$— and m in the formula —$(Ar_{11})_m$—$Ar_{12}$— are each independently an integer from 0 to 6. For example, n and m may be each independently 0, 1, 2, 3, 4, 5, or 6, but are not limited thereto.

Groups of $Ar_1$ in the formula —$(Ar_1)_n$—$Ar_2$— may be identical to or different from each other. For example, when n is 2, the two groups of $Ar_1$ in —$(Ar_1)_n$— may be both phenylene groups, or one of the two may be —N($Q_1$)- and the other may be a phenylene group. The descriptions of —$(Ar_{11})_m$—$Ar_{12}$— may be the same as those of —$(Ar_1)_n$—$Ar_2$— above.

$R_1$ through $R_3$, $R_{11}$ through $R_{15}$, $R_{17}$, $R_{18}$, and $R_{21}$ through $R_{29}$ in Formulae 41 and 42 may be defined as described above in connection with $Q_1$.

For example, $R_{13}$ may be a phenyl group, a naphthyl group, or an anthryl group, but is not limited thereto.

For example, $R_{28}$ and $R_{29}$ may be each independently selected from the group consisting of hydrogen, a methyl group, an ethyl group, a methoxy group, an ethoxy group, a phenyl group, a naphthyl group and an anthryl group, but are not limited thereto.

$L_1$ and $L_2$ in Formulae 41 and 42 may be defined as described above in connection with Ar1 and Ar11.

For example, $L_1$ and $L_2$ may be each independently a phenylene group, a carbazolylene group, or a phenylcarbazolylene group, but are not limited thereto.

In Formulae 41 and 42, a and b may be each independently an integer from 0 to 10. For example, a and b may be each independently 0, 1, 2, 3, 4, 5, 6, 7, 8, 9 or 10, but are not limited thereto.

For example, in Formula 42, $Ar_1$ in the formula —$(Ar_1)_n$—$Ar_2$— for $R_{10}$ and $Ar_{11}$ in the formula —$(Ar_{11})_m$—$Ar_{12}$— for $R_{16}$ may be each independently selected from the group consisting of a phenylene group; a carbazolylene group; a fluorenylene group; a methylfluorenylene group; a pyrazolylene group; a phenylpyrazolylene group; —N($Q_1$)-, wherein $Q_1$ is hydrogen, a phenyl group, a fluorenyl group, a dimethylfluorenyl group, a diphenylfluorenyl group, a carbazolyl group, or a phenylcarbazolyl group; a diphenylfluorenylene group; a triazinylene group; a methyltriazinylene group; a phenyltriazinylene group; a tetrafluorophenylene group; an ethylene group; and a methylphenylene group, wherein n and m may be each independently 0, 1, 2, 3, 4, 5 or 6, and $Ar_2$ and $Ar_{12}$ may be each independently selected from the group consisting of hydrogen, a cyano group, a fluoro group, a phenyl group, a cyanophenyl group, a naphthyl group, an anthryl group, a methyl group, a pyridinyl group, a carbazolyl group, a phenylcarbazolyl group, a fluorenyl group, a dimethylfluorenyl group, and a diphenylfluorenyl group. $R_{11}$, $R_{12}$, $R_{14}$, $R_{15}$, $R_{17}$, $R_{18}$, $R_{21}$ through $R_{27}$ may be hydrogen; $R_{13}$ may be selected from the group consisting of a phenyl group, a naphthyl group and an anthryl group; $R_{28}$ and $R_{29}$ may be each independently selected from the group consisting of hydrogen, a methyl group, an ethyl group, a methoxy group, an ethoxy group, a phenyl group, a naphthyl group and an anthryl group; $L_{11}$ may be a phenylene group; and b may be 0 or 1.

In some embodiments, the hole transporting compound may be any one of Compounds 1 through 37 below, but is not limited thereto:

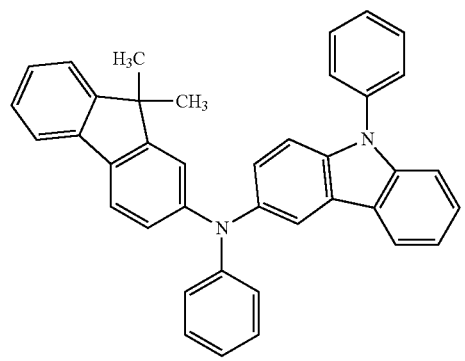

1

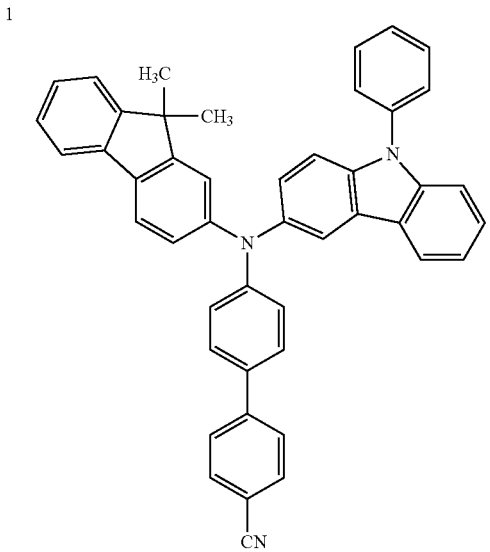

2

-continued
3
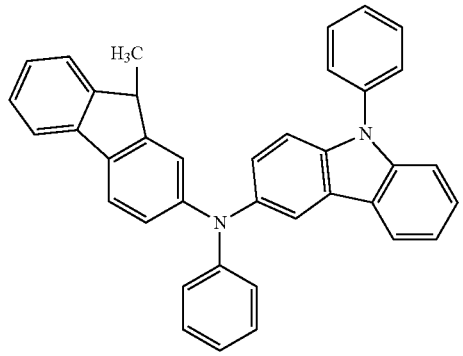
4
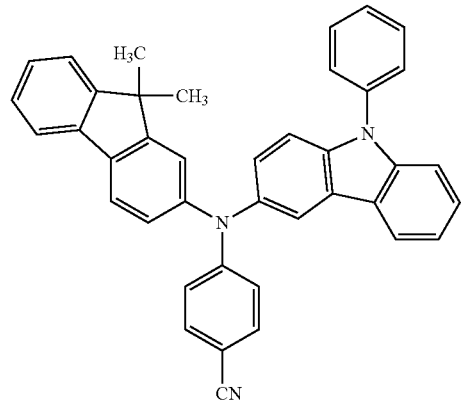
5
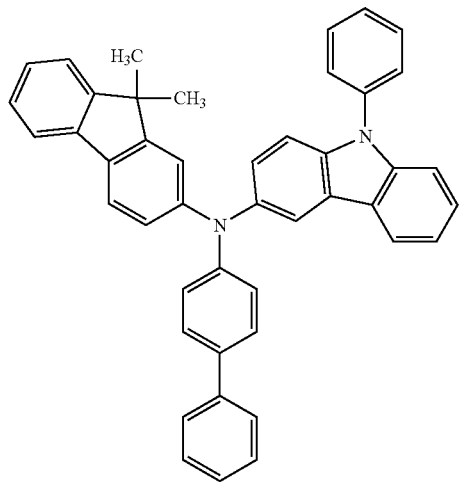
6
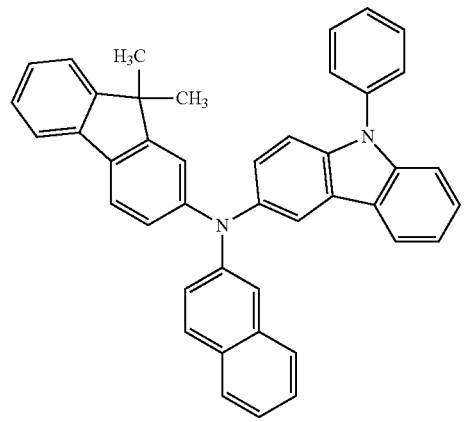
7
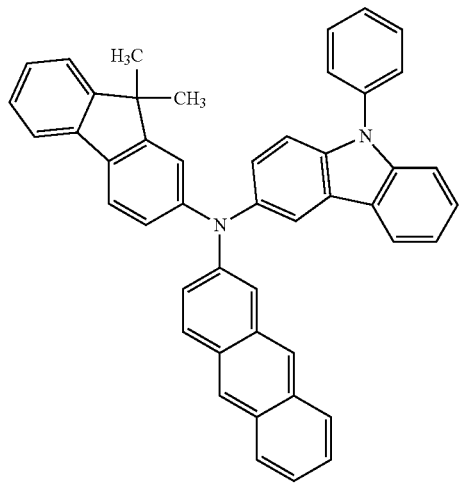
8
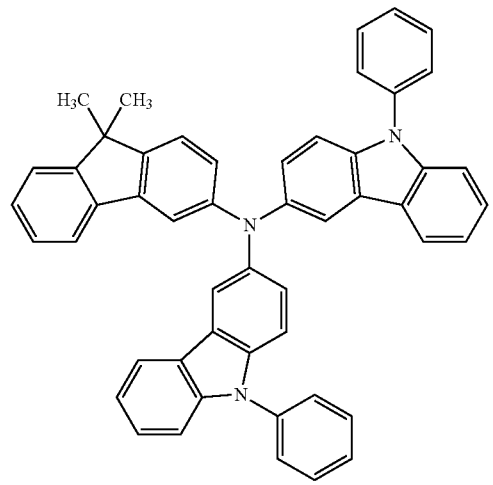

-continued
9
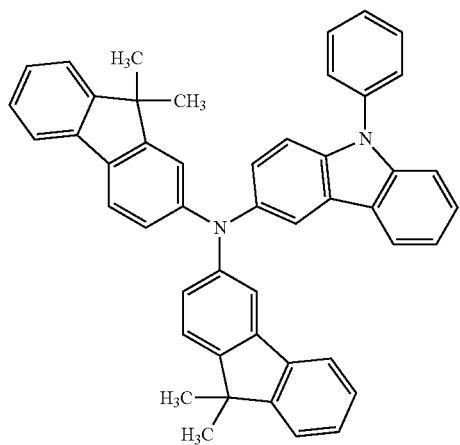
10
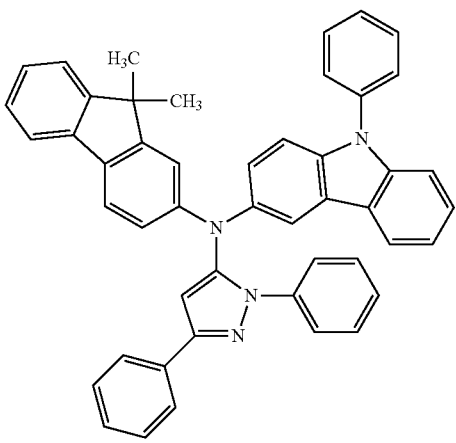
11
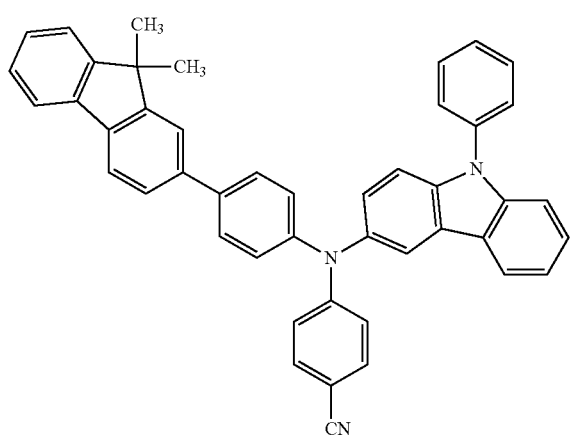
12
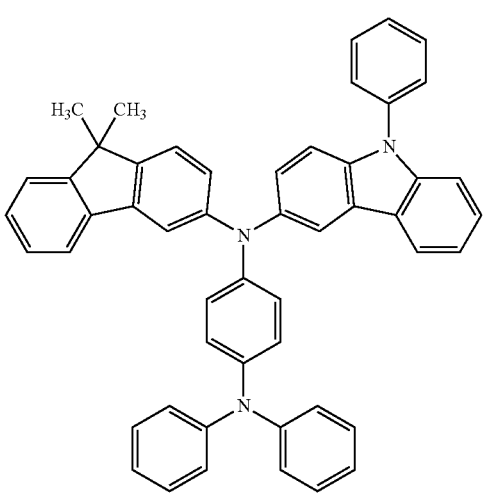
13
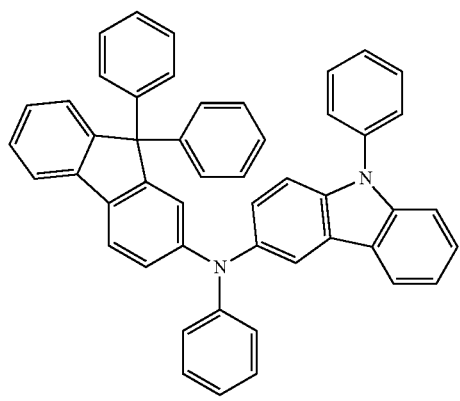
14
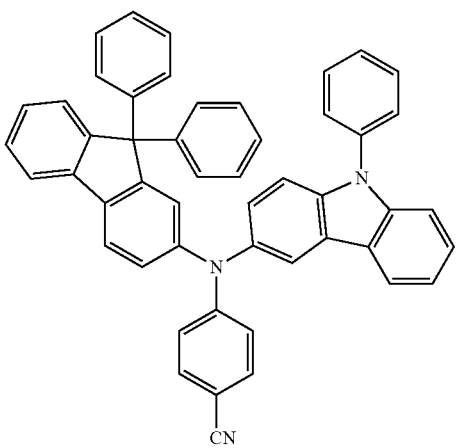

-continued
15
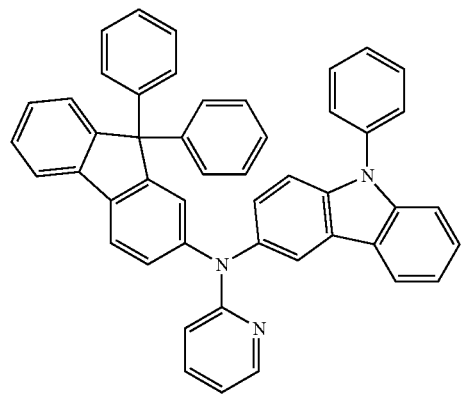
16
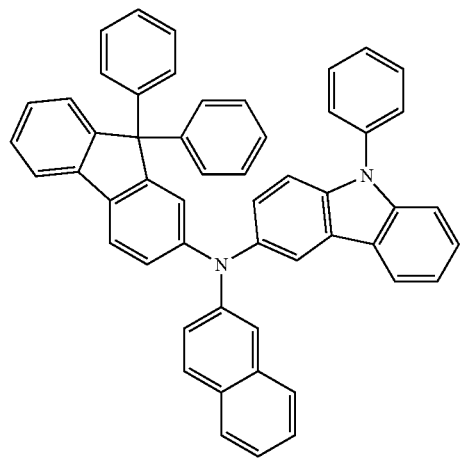
17
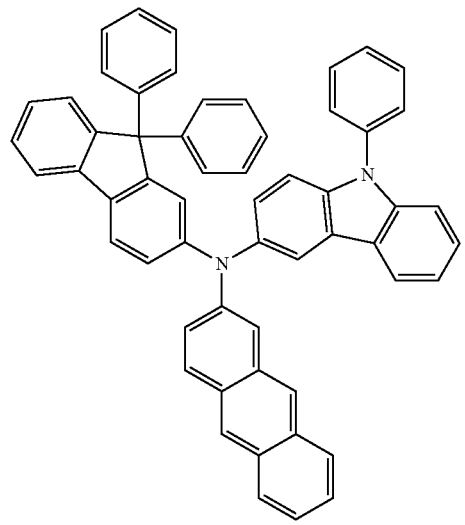
18
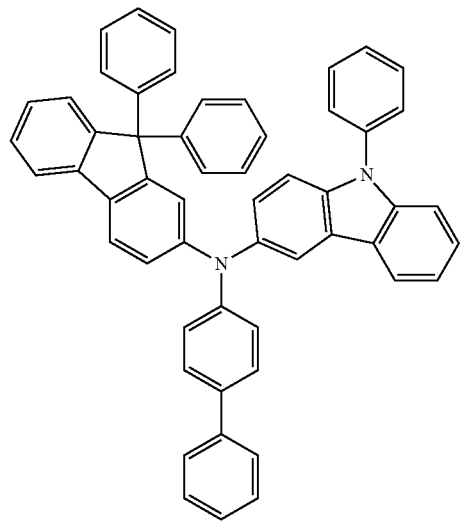
19
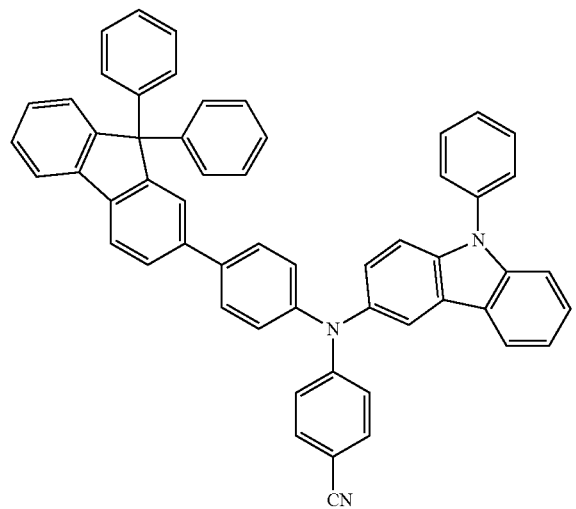
20
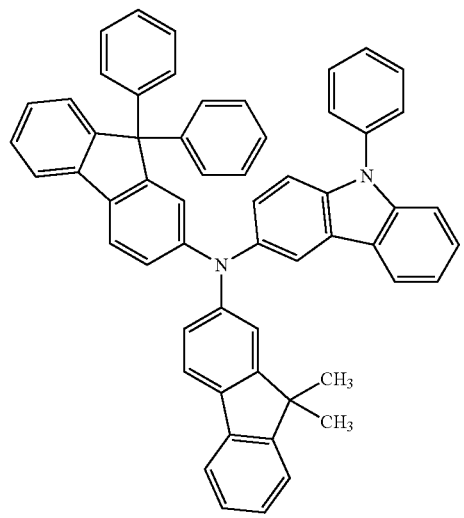

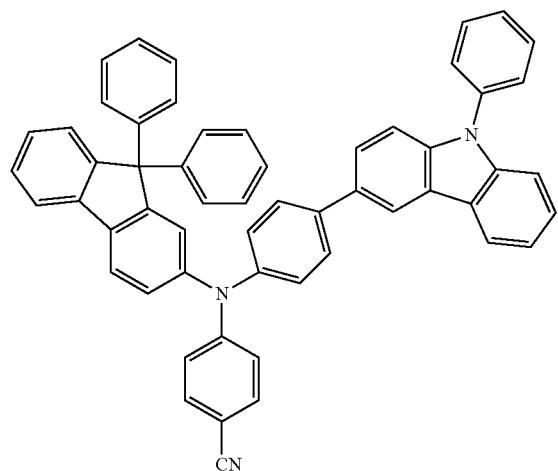
21
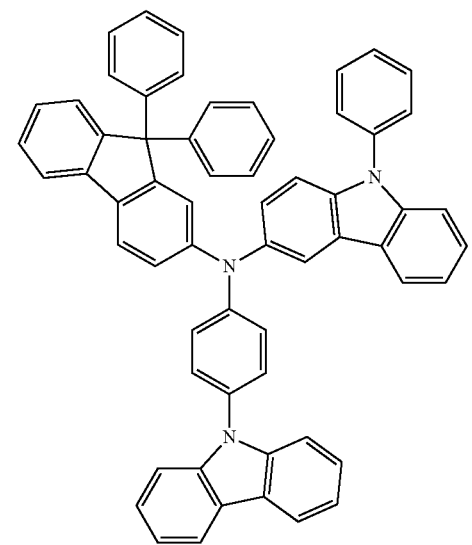
22
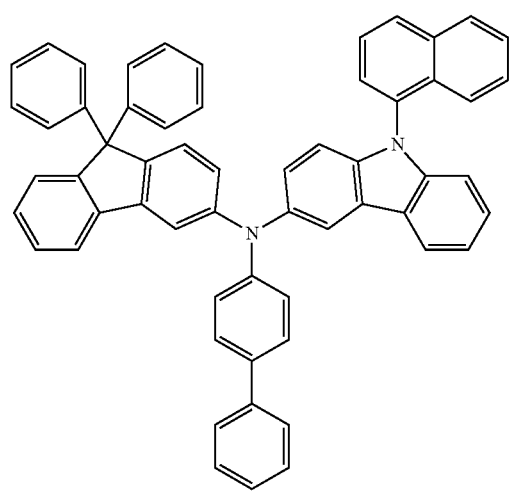
23
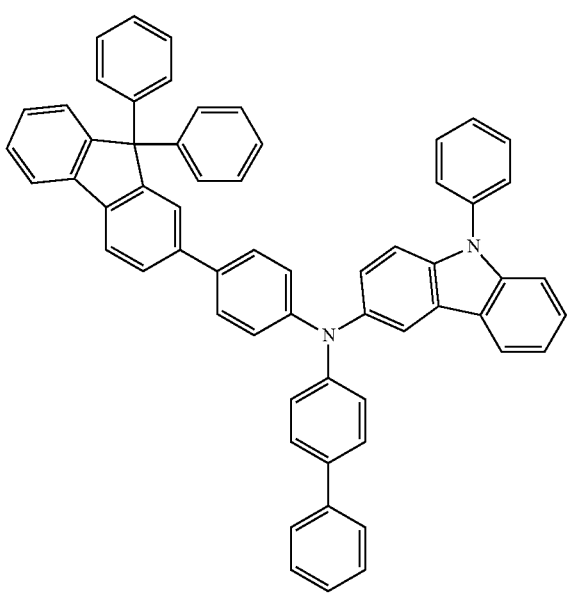
24
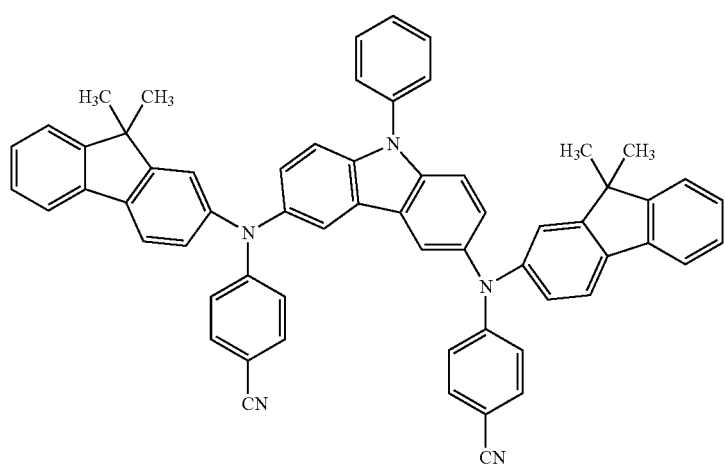
25

26
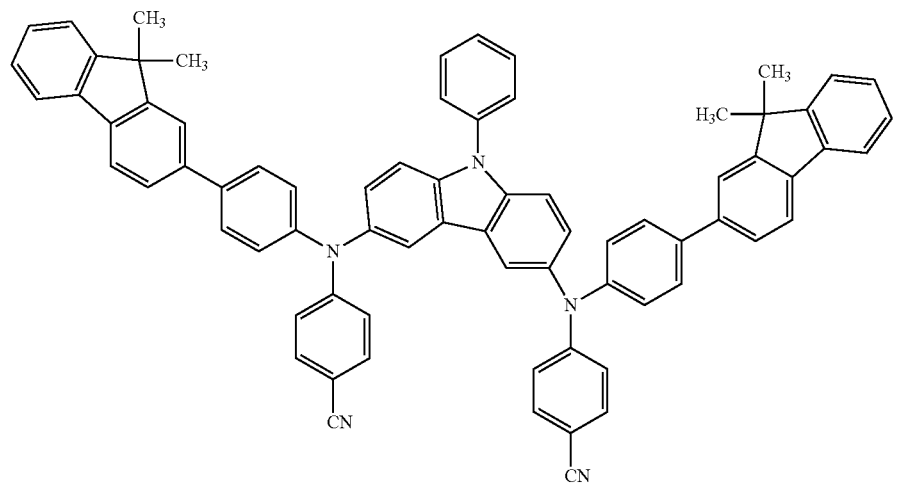
27
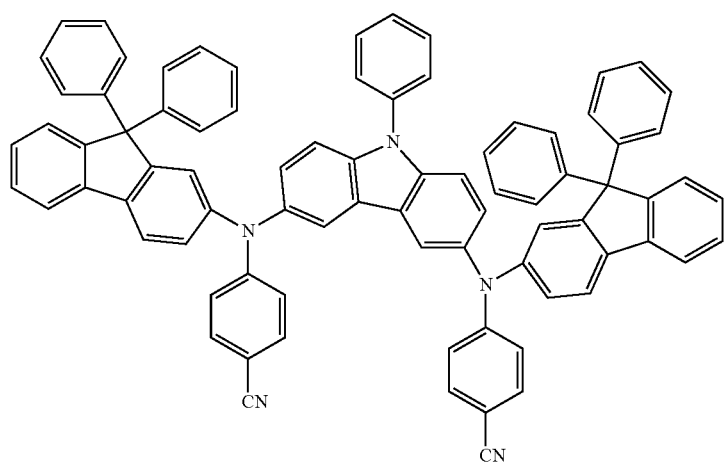
28
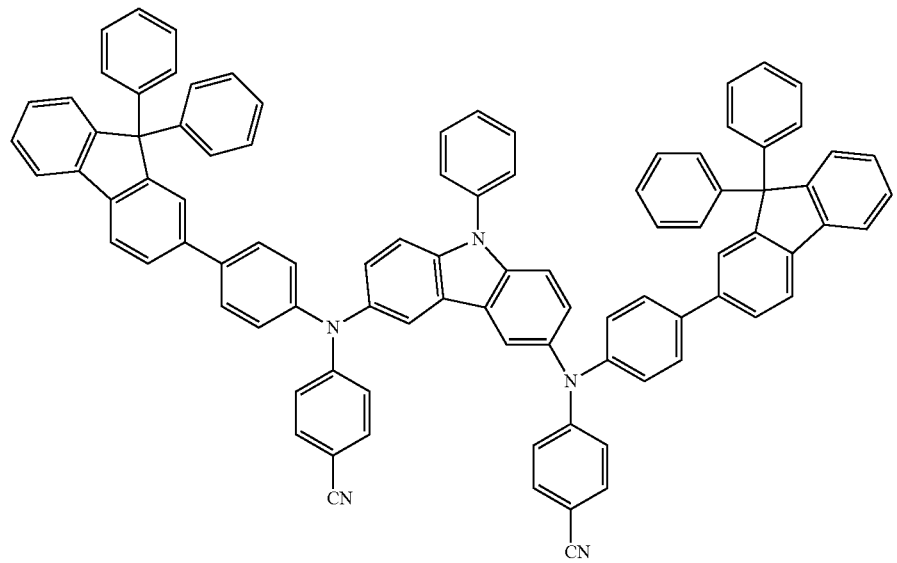

-continued
29
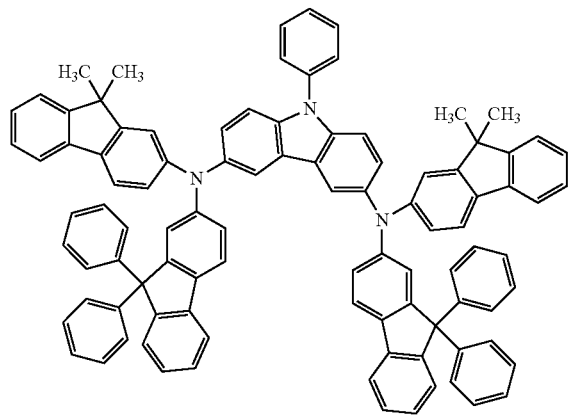
30
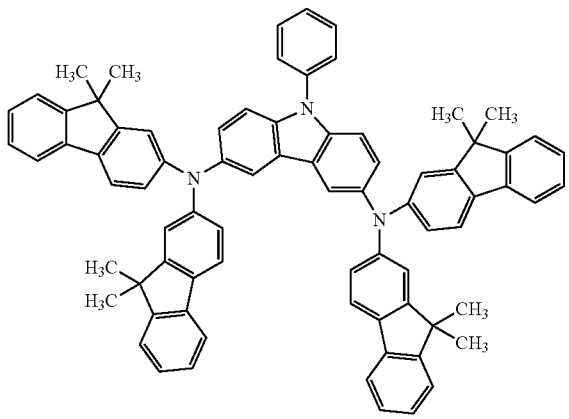
31
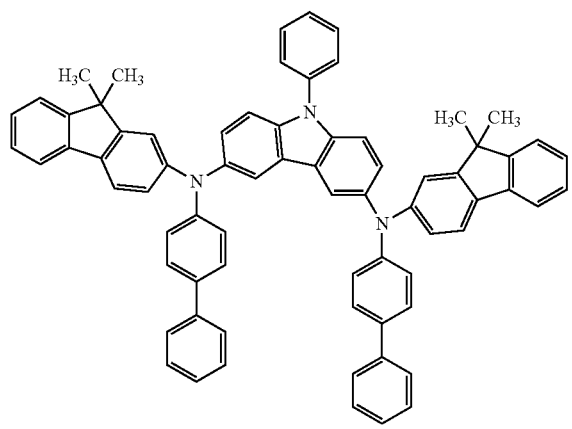
32
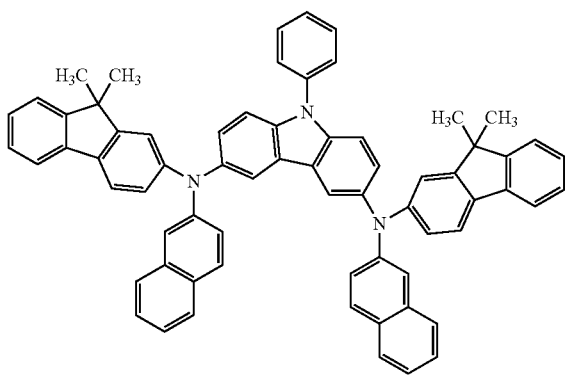
33
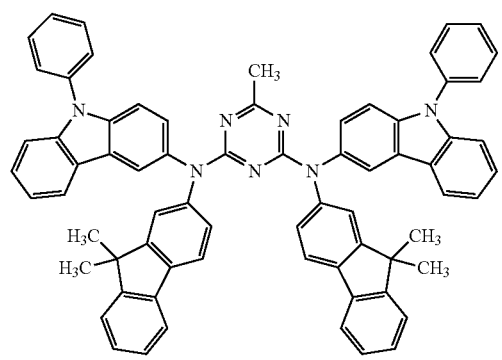
34
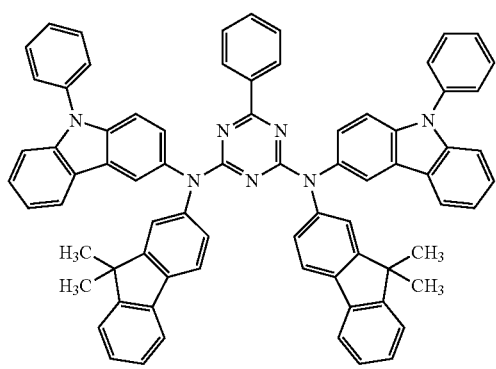
35
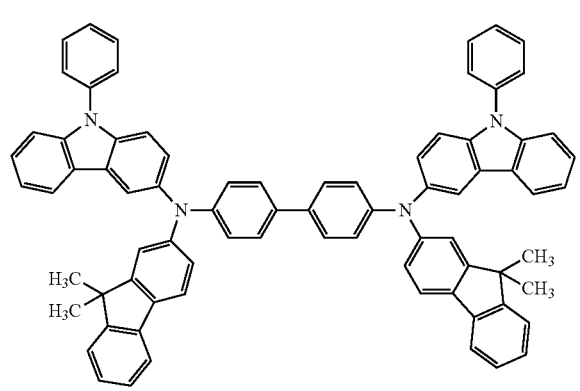
36
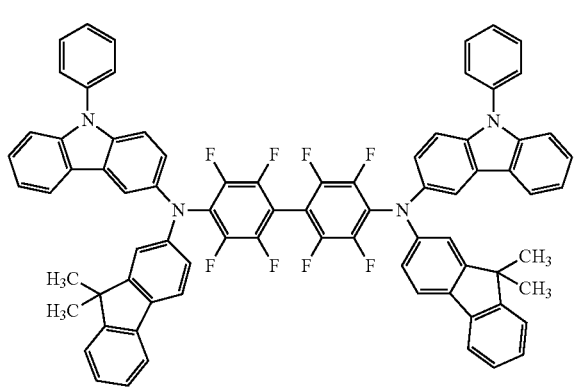

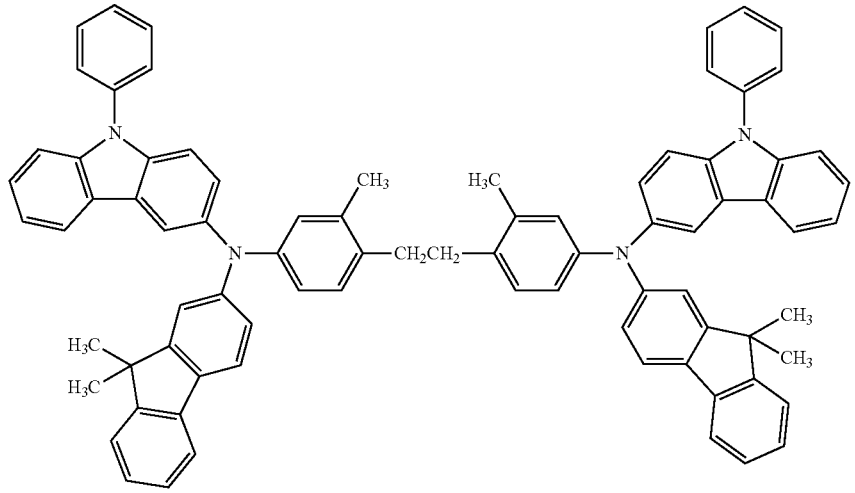

When the first layer 6 further includes a hole transporting material described above, in addition to the cyano group-containing compound, the amount of the cyano group-containing compound in the first layer 6 may be from about 0.1 to about 20 parts by weight, for example, from about 0.5 to about 15 parts by weight, or from about 0.5 to about 10 parts by weight, based on 100 parts by weight of the first layer 6. When the amount of the cyano group-containing compound is within this range, the driving voltage may be substantially decreased, and the emission and power efficiencies may be satisfactorily improved.

The thickness of the first layer 6 may be from about 10 Å to about 2100 Å, for example, from about 10 Å to about 500 Å, or from about 20 Å to about 200 Å. When the thickness of the first layer 6 is within this range, the driving voltage may be substantially decreased, and the emission and power efficiencies may be satisfactorily improved.

The organic layer 7 may be disposed on the first layer 6. The term "organic layer" used throughout the specification refers to any intervening layer between the first electrode 5 and the second electrode 9 (but excluding the first layer 6 described above). The organic layer 7 may be formed of pure organic materials, and may further include a metal complex.

The organic layer 7 may include an emission layer (EML).

The distance between the first layer 6 and the EML may be about 50 Å or greater, for example, about 100 Å or greater, or from about 100 Å to about 2,500 Å. When the distance between the first layer 6 and the EML is within this range, quenching of exitons in the emission layer caused by the cyano group-containing compound included in the first layer 6 may be substantially prevented, and thus, the OLED may have excellent quality.

The organic layer 7 may further include at least one layer selected from the group consisting of a hole injection layer (HIL), a hole transport layer (HTL), a hole blocking layer (HBL), an electron transport layer (ETL) and an electron injection layer (EIL), in addition to the EML.

For example, at least one layer selected from the group consisting of the HIL and the HTL may be further disposed between the first layer 6 and the EML. For example, the HTL may be further disposed between the first layer 6 and the EML, but is not limited thereto.

The HIL may be formed on the first layer 6 by vacuum deposition, spin coating, casting, Langmuir-Blodgett (LB) deposition, or the like.

When the HIL is formed using vacuum deposition, the deposition conditions may vary according to a compound that is used to form the HIL, and the structure and thermal properties of the HIL to be formed. In general, however, conditions for vacuum deposition may include a deposition temperature of from about 100 to about 500° C., a pressure of from about $10^{-8}$ to about $10^{-3}$ torr, and a deposition rate of from about 0.01 to about 100 Å/sec.

When the HIL is formed using spin coating, the coating conditions may vary according to a compound that is used to form the HIL, and the structure and thermal properties of the HIL to be formed. In general, however, the coating rate may be from about 2000 to to about 5000 rpm, and a temperature for heat treatment which is performed to remove a solvent after coating may be from about 80 to about 200° C.

The HIL may be formed of any material that is commonly used to form a HIL. Examples of the material that can be used to form the HIL include a phthalocyanine compound such as copperphthalocyanine, 4,4',4"-tris (3-methylphenylphenylamino) triphenylamine (m-MTDATA), nitrogen (N),N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS), but are not limited thereto.

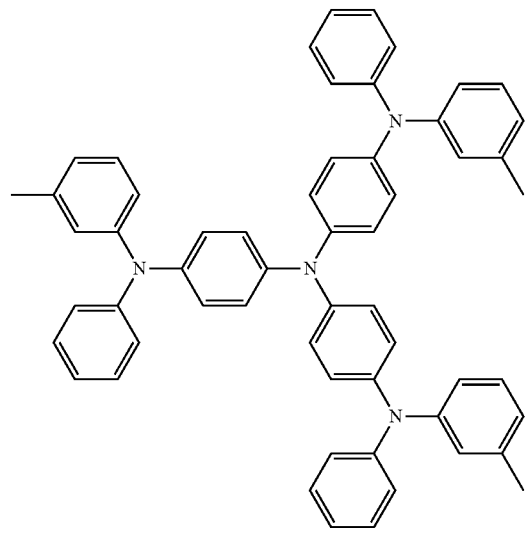

m-MTDATA

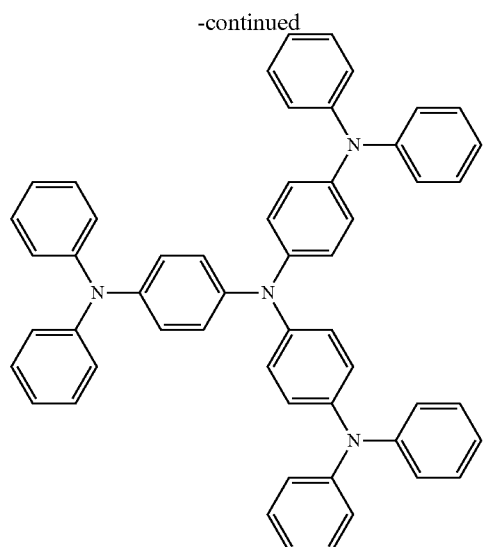

TDATA

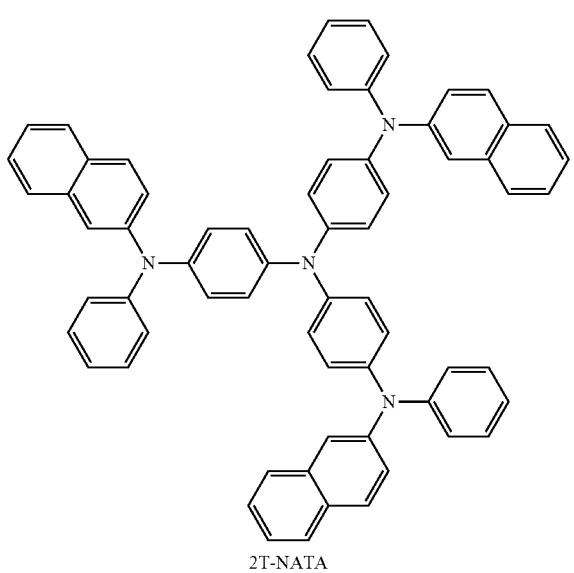

2T-NATA

The thickness of the HTL may be in the range of about 50 to 1,000 Å, for example, about 100 to about 2,500 Å. When the thickness of the HIL is within this range, the HIL may have excellent hole injecting ability without a substantial increase in driving voltage.

Then, a HTL may be formed on the HIL or on the first layer 6 by vacuum deposition, spin coating, casting, LB deposition, or the like. When the HTL is formed using vacuum deposition or spin coating, the conditions for deposition and coating may be similar to those for the formation of the HIL, although the conditions for the deposition and coating may vary according to the material that is used to form the HTL.

The HTL may be formed of the compound represented by Formula 41 or 42 described above.

The thickness of the HTL may be from about 50 to about 1,000 Å, for example, from about 100 to about 2,500 Å. When the thickness of the HTL is within this range, the HTL may have satisfactory hole transporting ability without a substantial decrease in driving voltage.

Then, the EML may be formed on the HTL by using vacuum deposition, spin coating, casting, LB deposition, or the like. When the EML is formed using vacuum deposition or spin coating, the conditions for deposition and coating may be similar to those for the formation of the HIL, although the conditions for deposition and coating may vary according to the material that is used to form the EML.

The EML may include a compound, or a combination of a host and a dopant. Examples of the host material include aluminum this(8-hydroxyquinoline) (Alq3), 4,4'-N,N'-dicarbazole-biphenyl (CBP), poly(n-binylcarbazole (PVK), TCTA, 1,3,5-tris(N-phenylbenzimidazole-2-yl)benzene) (TPBI), E3, distyryl arylene (DSA), a compound represented by Formula 51 below, a compound represented by Formula 52, a compound represented by Formula 53, and a compound represented by Formula 54, but are not limited thereto.

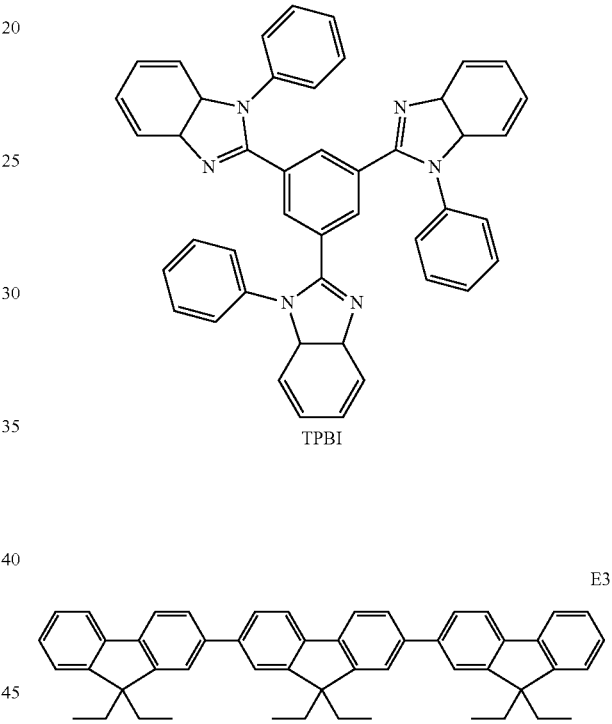

TPBI

E3

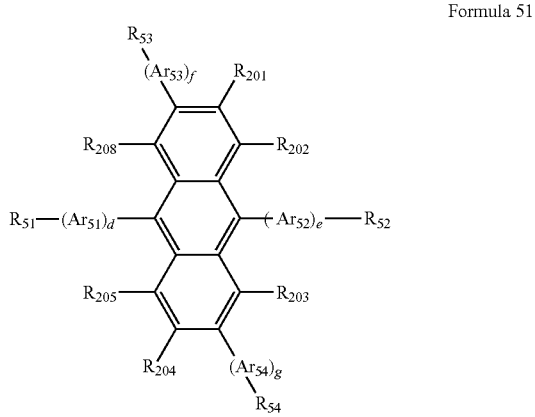

Formula 51

Formula 52

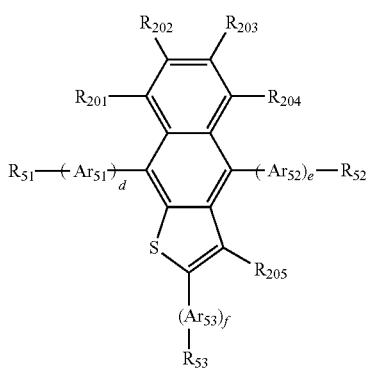

Formula 53

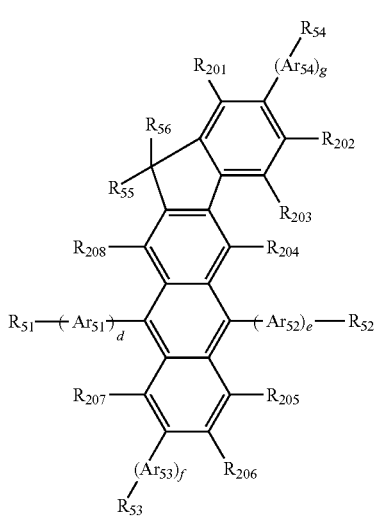

Formula 54

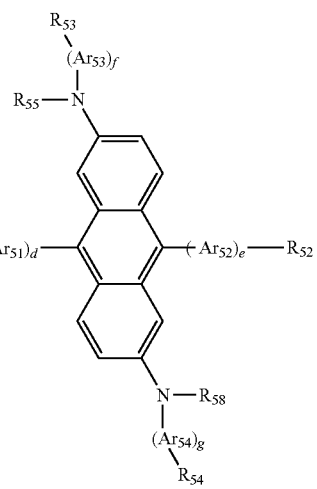

In Formulae 51 through 54, $Ar_{51}, A_{52}, Ar_{53}$ and $Ar_{54}$ may be defined as described above in connection with Ar1.

In Formulae 51 through 54, $Ar_{51}, A_{52}, Ar_{53}$ and $Ar_{54}$ may be each independently selected from the group consisting of a phenylene group, a naphthylene group, an anthrylene group, and a phenyl-substituted anthrylene group, but are not limited thereto.

In Formulae 51 through 54, $R_{201}$ through $R_{209}$ and $R_{51}$ through $R_{56}$ may be defined as described above in connection with $Ar_2$. For example, $R_{201}$ through $R_{209}$ may be hydrogen.

In Formulae 51 through 54, d, e, f and g may be each independently an integer from 0 to 10. For example, d, e, f and g may be each independently 0, 1, or 2, but are not limited thereto.

In Formulae 51 through 54, $R_{51}$ through $R_{56}$ may be each independently selected from the group consisting of hydrogen, a methyl group, an ethyl group, a propyl group, a butyl group, a phenyl group, a naphthyl group, an anthryl group, a pyrenyl group, a carbazolyl group, and $-N(Q_2)(Q_3)$, wherein $Q_2$ and $Q_3$ may be each independently selected from the group consisting of a methyl group, a phenyl group, a naphthyl group and an anthryl group.

In some embodiments, the EML of the organic layer 7 may include one compound selected from the group consisting of Compounds 51 through 58 below, as a host, but is not limited thereto.

Compound 51

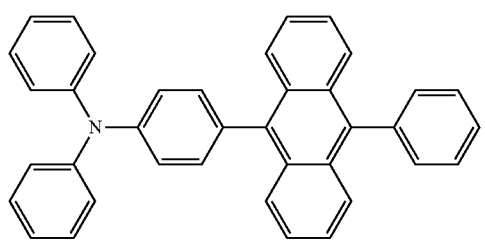

Compound 52

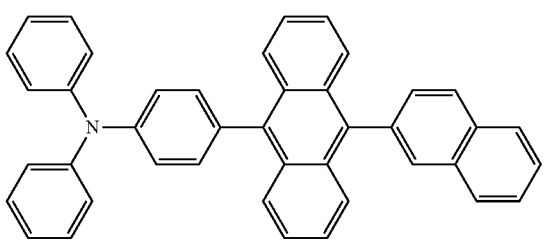

Compound 53
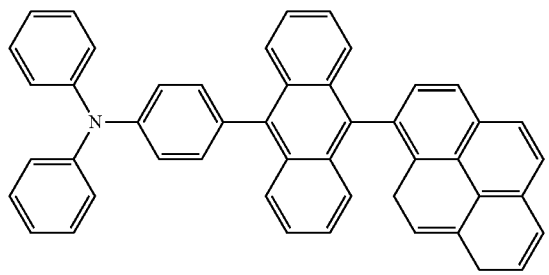
Compound 54
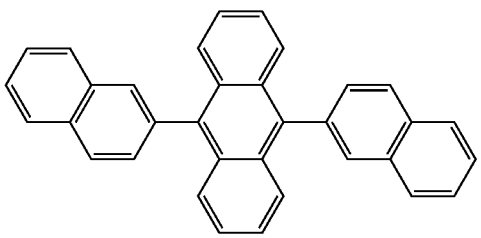
Compound 55
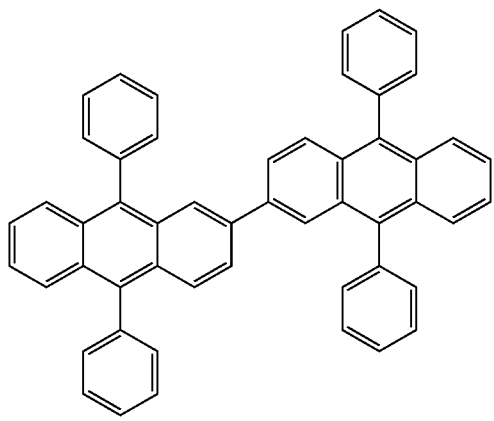
Compound 56
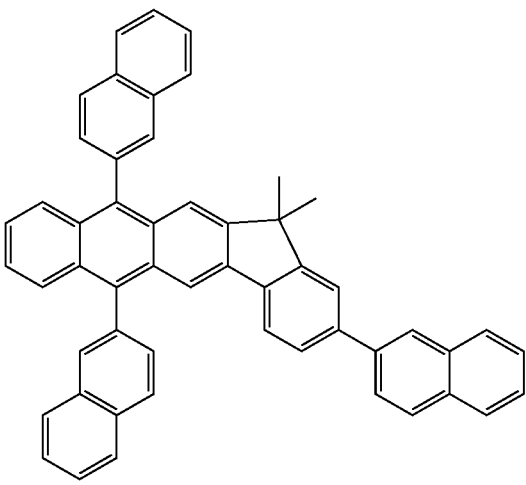
Compound 57
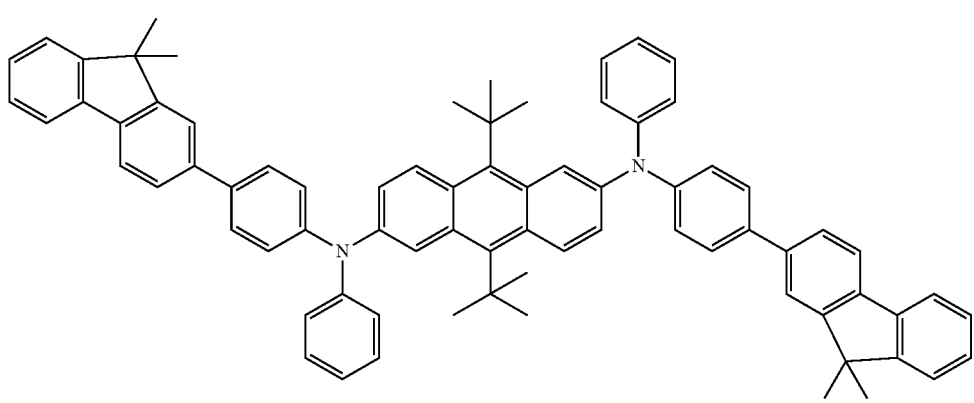
Compound 58
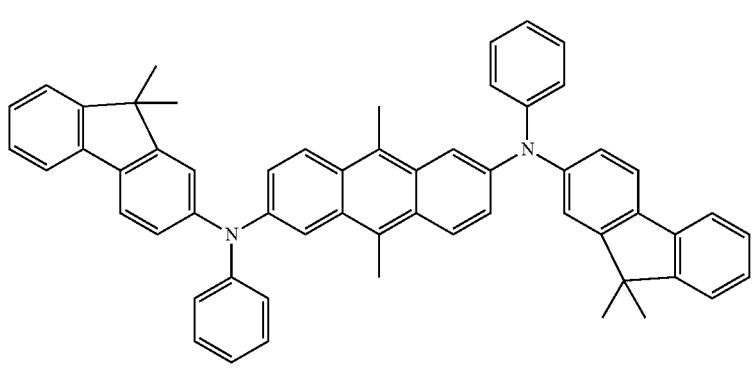

Examples of red dopants include PtOEP, Ir(piq)$_3$, and Btp$_2$Ir(acac), but are not limited thereto.

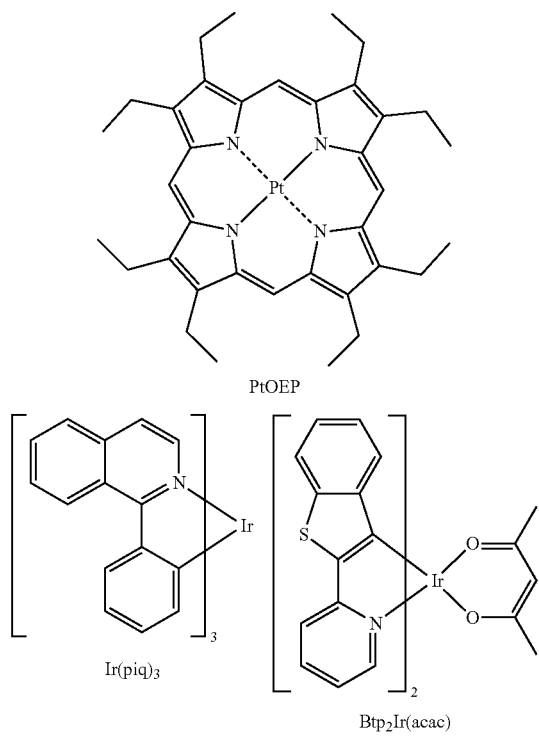

PtOEP

Ir(piq)$_3$

Btp$_2$Ir(acac)

Examples of green dopants include Ir(ppy)$_3$ (ppy=phenylpyridine), Ir(ppy)$_2$(acac), Ir(mpyp)$_3$, the compound of Formula 51 above, a compound of Formula 71 below, and a compound of Formula 72 below, but are not limited thereto.

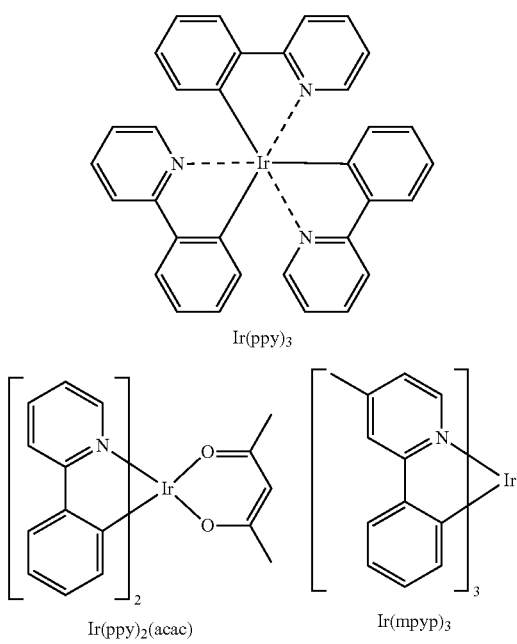

Ir(ppy)$_3$

Ir(ppy)$_2$(acac)

Ir(mpyp)$_3$

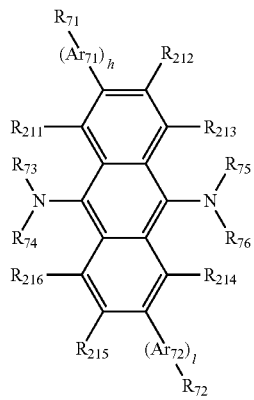

Formula 71

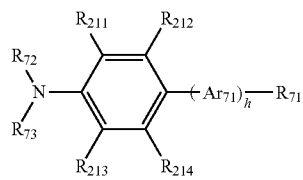

Formula 72

In Formulae 71 and 72, Ar$_{71}$ and Ar$_{72}$ may be defined as described above in connection with Ar$_1$.

In Formulae 71 through 72, Ar$_{71}$ and A$_{72}$ may be each independently selected from the group consisting of an ethenylene group, a phenylene group, a naphthylene group, an anthrylene group, and a phenyl-substituted anthrylene group, but are not limited thereto.

In Formulae 71 through 72, R$_{211}$ through R$_{216}$ and R$_{71}$ through R$_{76}$ may be defined as described above in connection with Ar$_2$. For example, R$_{211}$ through R$_{216}$ may be hydrogen.

In Formula 71 and 72, h and i may be each independently an integer from 0 to 10. For example, h and i may be each independently 0, 1 or 2, but are not limited thereto.

In Formulae 71 and 72, R$_{71}$ through R$_{76}$ may be each independently selected from the group consisting of a methyl group, an ethyl group, an ethenyl group, a phenyl group, a methylphenyl group, a naphthyl group, a methylnaphthyl group, an anthryl group, a methylanthryl group, a pyrenyl group and —N(Q$_2$)(Q$_3$), wherein Q$_2$ and Q$_3$ may be each independently selected from the group consisting of a methyl group, a phenyl group, a naphthyl group and an anthryl group.

In some embodiments, the EML may include one compound selected from the group consisting of Compounds 51 through 58 above and Compounds 71 through 76 below, as a host, but is not limited thereto.

Compound 71

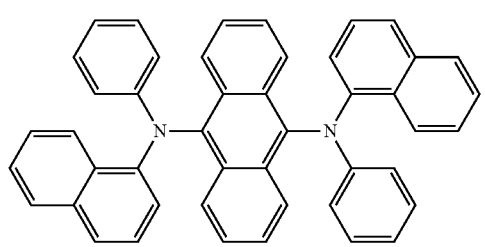

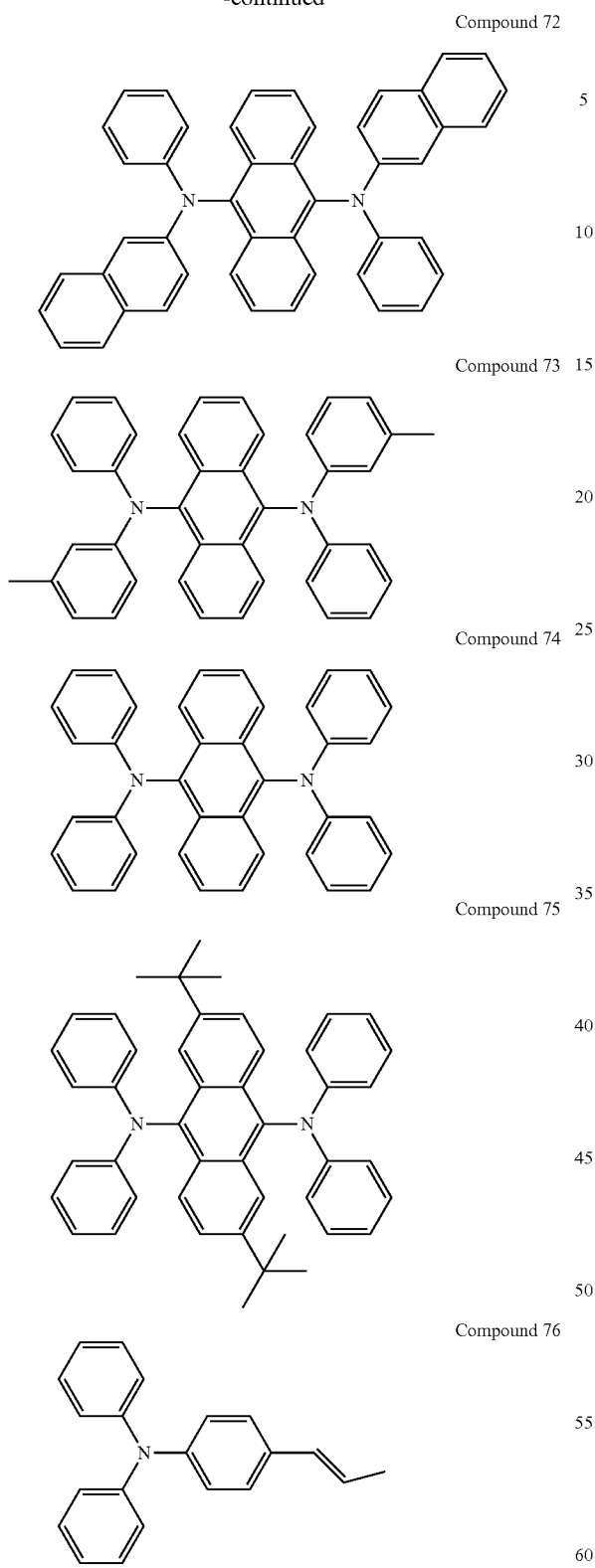
Compound 72
Compound 73
Compound 74
Compound 75
Compound 76
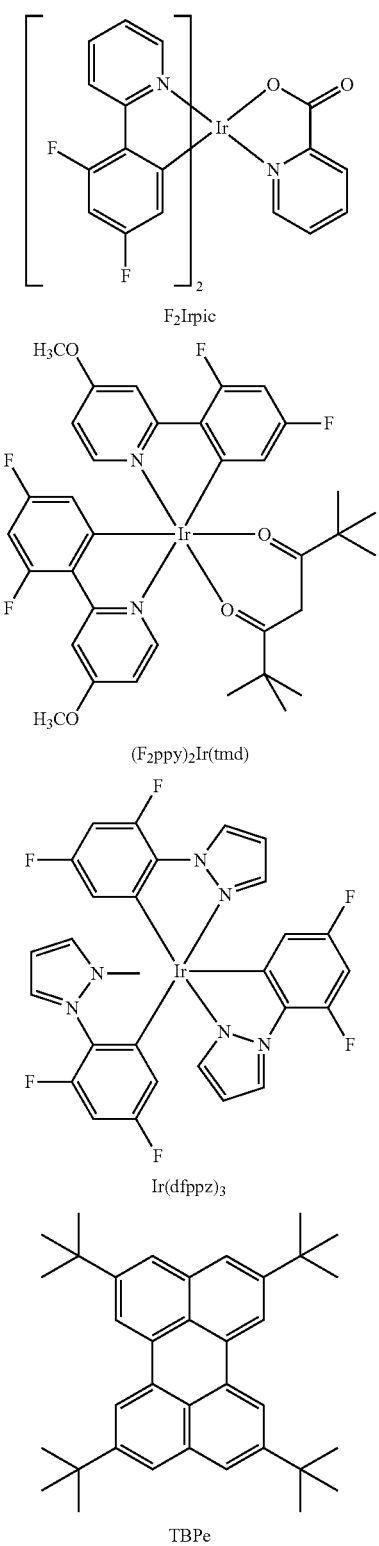
F₂Irpic
(F₂ppy)₂Ir(tmd)
Ir(dfppz)₃
TBPe
Examples of blue dopants include F₂Irpic, (F₂ppy)₂Ir(tmd), Ir(dfppz)₃, ter-fluorene, 4,4'-bis(4-diphenyl aminostyryl)biphenyl (DPAVBi), 2,5,8,11-tetra-tert-butyl perylene (TBP), and compounds represented by Formulae 51, 54, 81, and 82, but are not limited thereto.
Formula 81
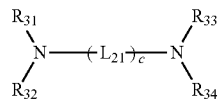

-continued

Formula 82

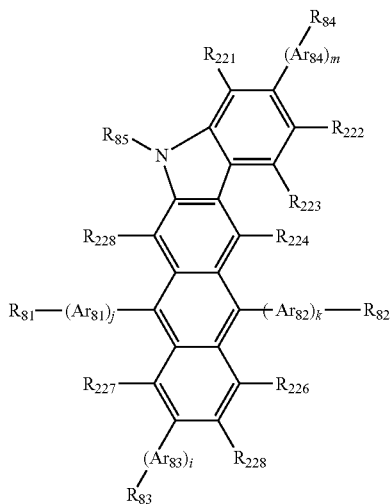

In Formula 81, $L_{21}$ may be selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group and a substituted or unsubstituted $C_3$-$C_{30}$ heteroarylene group; c may be an integer from 1 to 20; c groups of $L_{21}$ in -($L_{21}$)$_c$- may be identical to or different from each other; $R_{31}$ through $R_{34}$ may be each independently selected from the group consisting of a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group and a substituted or unsubstituted $C_3$-$C_{30}$ heteroaryl group.

In Formula 81, $L_{21}$ may be defined as described above in connection with $Ar_1$ (the description of —N($Q_1$)- is excluded), and $R_{31}$ through $R_{34}$ may be defined as described above in connection with $Q_1$ (the description of —N($Q_2$)($Q_3$) is excluded).

In Formula 81, $L_{21}$ may be an ethenylene group, a propenylene group, or a phenylene group.

In Formula 81, c may be 1, 2, 3, 4, 5, or 6.

In Formula 81, $R_{31}$ through $R_{34}$ may be each independently selected from the group consisting of hydrogen, a methyl group, an ethyl group, a propyl group, a butyl group, a methoxy group, an ethoxy group, a propoxy group, a butoxy group, a phenyl group, a naphthyl group, and an anthryl group.

In Formula 81, groups of $L_{21}$ in -($L_{21}$)$_c$- may be identical to or different from each other. For example, when c is 2, the two groups of $L_{21}$ may be both phenylene groups, or one of the two may be a phenylene group, and the other may be an ethenylene group.

In Formula 82, $Ar_{81}$ through $Ar_{84}$ may be defined as described above in connection with $Ar_1$.

In Formula 82, $Ar_{31}$, $A_{32}$, $Ar_{33}$ and $Ar_{34}$ may be each independently selected from the group consisting of a phenylene group, a naphthylene group, an anthrylene group, and a phenyl-substituted anthrylene group, but are not limited thereto.

In Formula 82, $R_{221}$ through $R_{228}$ and $R_{81}$ through $R_{85}$ may be defined as described above in connection with $Ar_2$. For example, $R_{221}$ through $R_{228}$ may be hydrogen.

In Formula 82, j, k, l and m may be each independently an integer from 0 to 10. For example, j, k, l and m in Formula 82 may be each independently 0, 1 or 2, but are not limited thereto.

In Formula 82, $R_{81}$ through $R_{85}$ may be each independently selected from the group consisting of hydrogen, a methyl group, an ethyl group, a propyl group, a butyl group, a phenyl group, a naphthyl group, an anthryl group, pyrenyl group, a carbazolyl group, and —N($Q_2$)($Q_3$), wherein $Q_2$ and $Q_3$ may be each independently selected from the group consisting of a methyl group, a phenyl group, a naphthyl group and an anthryl group.

The compound of Formula 81 may be Compound 40 below, but is not limited thereto:

Compound 40

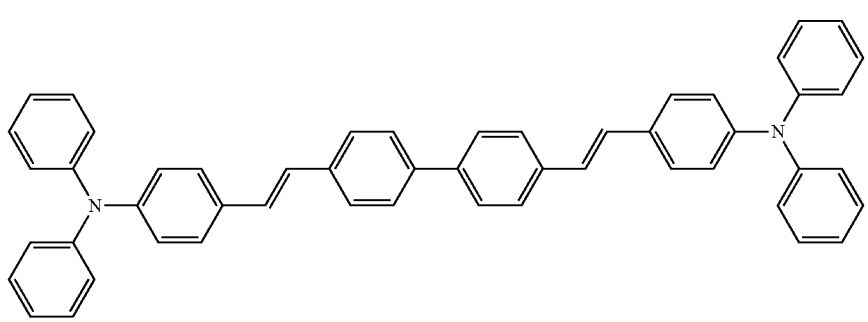

The compound of Formula 82 may be Compound 41 or 42 below, but is not limited thereto:

Compound 41

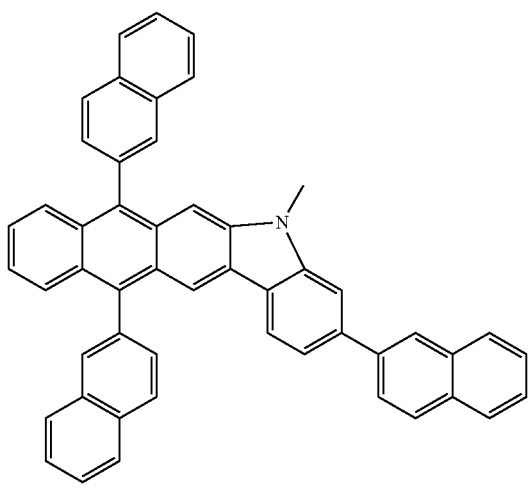

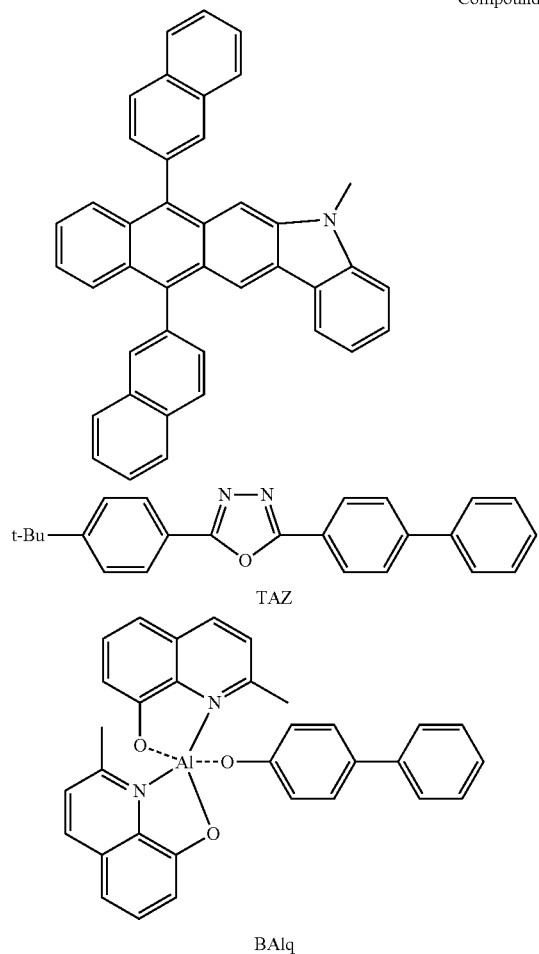

Compound 42

TAZ

BAlq

The thickness of the ETL may be from about 100 to about 1,000 Å, for example, from about 150 to about 500 Å. When the thickness of the ETL is within this range, the ETL may have satisfactory electron transporting ability without a substantial increase in driving voltage.

Then, an EIL may be formed on the ETL. The EIL may be formed of any material facilitating injection of electrons from the cathode.

Examples of materials for forming the EIL include LiF, NaCl, CsF, $Li_2O$, and BaO, which are known in the art. Deposition and coating conditions for forming the EIL are similar to those for the formation of the HIL, although the deposition and coating conditions may vary according to a material that is used to form the EIL.

The thickness of the EIL may be in the range of about 1 to about 100 Å, for example, about 5 to about 90 Å. When the thickness of the EIL is within this range, the EIL may have satisfactory electron injecting ability without a substantial increase in driving voltage.

The second electrode 9 is disposed on the organic layer 7. The second electrode 9 may be a cathode, which is an electron injecting electrode. A metal for forming the second electrode 9 may be a metal, an alloy, an electrically conductive compound, which have a low-work function, or a mixture thereof. In this regard, the second electrode 9 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In addition, the transmission electrode may be formed of indium tin oxide (ITO) or indium zinc oxide (IZO) to manufacture a top-emission type light-emitting device.

For example, an OLED according to an embodiment may have a structure including: an Al-containing zinc oxide layer; a first layer including a cyano group-containing compound represented by one of Formulae 1A through 20B, wherein the first layer may further include a hole transporting compound of Formula 42; a HTL including the compound of Formula 42; an EML including a host (one of the compounds 51 through 54) and a dopant (one of the compounds 51 through 54, 71, and 72); an ETL; an EIL; and a second electrode, which are sequentially stacked in this order. Thus, the OLED may emit excellent green light due to the structure. The green light may be emitted according to a fluorescent light-emitting mechanism. The maximum emission peak of the green light may be may be from about 490 to about 560 nm.

An OLED according to another embodiment may have a structure including: an Al-containing zinc oxide layer; a first layer including a cyano group-containing compound represented by one of Formulae 20A and 20B, wherein the first layer may further include a hole transporting compound selected from among the compounds 1 through 37; a HTL including one of the compounds 1 through 37; an EML including a host (one of the Compounds 51 through 58) and a dopant (one of the compounds 40 through 42, and 51 through 58); an ETL; an EIL; and a second electrode, which are sequentially stacked in this order. Thus, the OLED may emit excellent green light due to the structure.

Figure 2:
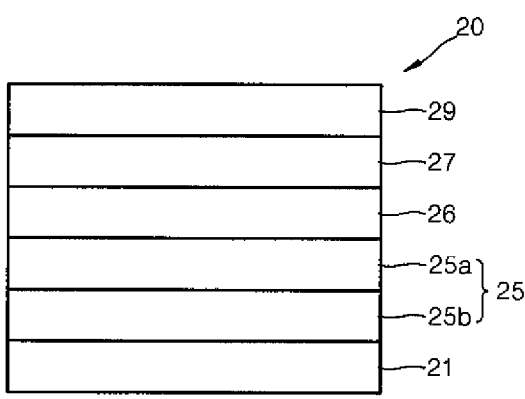
FIG. 2 is a cross-sectional view illustrating a structure of an OLED according to another embodiment.

FIG. 2 is a schematic sectional view of an OLED 20 according to another embodiment. Referring to FIG. 2, the OLED 20 according to the present embodiment includes a substrate 21, a first electrode 25, a first layer 26 including a cyano group-containing compound, an organic layer 27 and a second electrode 29, wherein the first electrode 25 includes a transparent conductive layer 25b and a first element-containing zinc oxide layer 25a, which are disposed in this order on the substrate 21. The substrate 21, the first element-containing zinc oxide layer 25a, the first layer 26 including a cyano group-containing compound, the organic layer 27, and the second electrode 29 are the same as described above in detail with reference to FIG. 1.

Referring to FIG. 2, the first electrode 25 of the OLED 20 further includes the transparent conductive layer 25b as compared to the OLED 10 in FIG. 1.

The transparent conductive layer 25b may be formed of, for example, a transparent conductive metal oxide. Examples of transparent conductive metal oxides include ITO and tin oxide ($SnO_2$), but are not limited thereto. For example, the transparent conductive layer 25b may be formed of ITO.

The thickness of the transparent conductive layer 25b may be from about 5 nm to about 100 nm, for example, from about 7 nm to about 80 nm. When the thickness of the transparent conductive layer 25b is within this range, the OLED may have excellent efficiency.

For example, an OLED according to an embodiment may have a structure including: a transparent conductive layer formed of ITO; an Al-containing zinc oxide layer; a first layer including a cyano group-containing compound represented by one of Formulae 1A through 20B, wherein the first layer may further include a hole transporting compound of Formula 42; a HTL including the compound of Formula 42; an EML including a host (one of the compounds 51 through 54) and a dopant (one of the compounds 51 through 54, and 72); an ETL; an EIL; and a second electrode, which are sequentially stacked in this order. Thus, the OLED may emit excellent green light due to the structure. The green light may be emitted according to a fluorescent light-emitting mechanism. The maximum emission peak of the green light may be may be from about 490 to about 560 nm.

An OLED according to another embodiment may have a structure including: a transparent conductive layer formed of ITO; an Al-containing zinc oxide layer; a first layer including a cyano group-containing compound represented by one of Formulae 20A and 20B, wherein the first layer may further include a hole transporting compound selected from among the compounds 1 through 37; a HTL including one of the compounds 1 through 37; an EML including a host (one of the Compounds 51 through 58) and a dopant (one of the compounds 40 through 42, and 51 through 58); an ETL; an EIL; and a second electrode, which are sequentially stacked in this order. Thus, the OLED may emit excellent green light due to the structure.

The OLEDs 10 and 20 according to the embodiments are illustrated in FIGS. 1 and 2. However, the present embodiments are not limited thereto.

For example, any of the OLEDs 10 and 20 may further include a metal layer between the first element-containing zinc oxide layer 5a (25a) and the substrate 1 (21). The metal layer may function as a barrier layer that blocks diffusion of the first element (metal element) in the first element-containing zinc oxide layer 5a (25a) into the substrate 1 (21). The metal layer may include at least one metal selected from the group consisting of molybdenum (Mo), tungsten (W), titanium (Ti), palladium (Pd), platinum (Pt), and gold (Au), but is not limited thereto. For example, the metal layer may include a Ti layer. The metal layer may have a thickness of about 20 nm to about 200 nm, for example, about 50 nm to about 100 nm. When the thickness of the metal layer is within this range, the diffusion of the first element may be effectively prevented. However, the thickness of the metal layer is not limited thereto.

Any of the OLEDs 10 and 20 may further include at least one layer selected from the group consisting of a HIL and a HTL between the first electrode 5 (25) and the first layer 6 (26). For example, an OLED according to an embodiment may have a structure including: a substrate; a first electrode (including a first element-containing zinc oxide layer, and optionally further including a transparent conductive layer), a first HTL, a first layer, a second HTL, an EML, an ETL, an EIL, and a second electrode, which are sequentially stacked in this order.

Alternatively, the OLED may include multiple first layers. For example, an OLED according to an embodiment may have a structure including: a substrate; a first electrode (including a first element-containing zinc oxide layer, and optionally further including a transparent conductive layer), a first layer, a HTL, another first layer, another HTL, an EML, an ETL, an EIL, and a second electrode, which are sequentially stacked in this order.

Hereinafter, one or more embodiments will be described in detail with reference to the following examples. However, these examples are not intended to limit the purpose and scope of the one or more embodiments.

EXAMPLE

Comparative Example 1

A 15 Ω/cm² (1,200 Å) ITO glass substrate (available from Corning Co.) was cut to a size of 50 mm×50 mm×0.7 mm, ultrasonically washed with isopropyl alcohol for 5 minutes and then with pure water for 5 minutes, and washed again with UV ozone for 30 minutes. An Al-containing zinc oxide layer (Al was doped to a concentration of about 2 parts by weight based on 100 parts by weight of the Al-containing zinc oxide layer) was formed on the ITO glass substrate to a thickness of 400 Å, thereby forming an anode including ITO and the Al-containing zinc oxide layer. Then, m-MTDATA was vacuum-deposited on the Al-containing zinc oxide layer to form a HIL having a thickness of 750 Å, and then Compound 5 above was vacuum-deposited on the HIL to form a HTL having a thickness of 750 Å. 97 wt % of Compound 56 above as a host and 3 wt % of Compound 58 above as a dopant were deposited on the HTL to form an EML having a thickness of 200 Å. Alq3 was vacuum-deposited on the EML to form an ETL having a thickness of 300 Å. Liq was vacuum-deposited on the ETL to form an EIL having a thickness of 5 Å and Mg and Ag were vacuum-deposited on the EIL to form a cathode having a thickness of 160 Å. Next, Alq3 was deposited on the cathode to form a protection layer having a thickness of 600 Å, thereby completing the manufacture of an OLED.

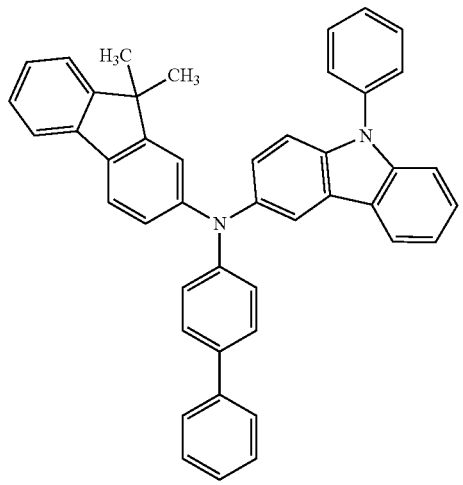

Compound 5

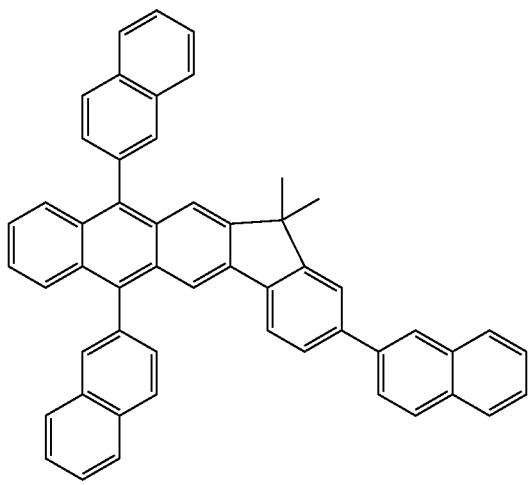

Compound 56

Compound 58

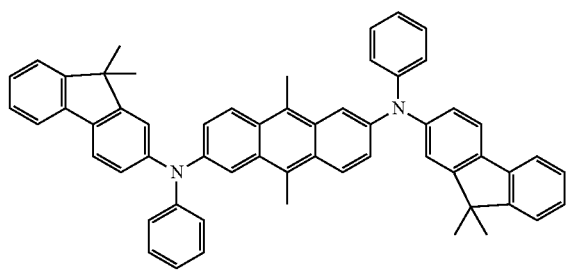

Example 1

A 15 Ω/cm² (1,200 Å) ITO glass substrate (available from Corning Co.) was cut to a size of 50 mm×50 mm×0.7 mm, ultrasonically washed with isopropyl alcohol for 5 minutes and then with pure water for 5 minutes, and washed again with UV ozone for 30 minutes. An Al-containing zinc oxide layer (Al was doped to a concentration of about 2 parts by weight based on 100 parts by weight of the Al-containing zinc oxide layer) was formed on the ITO glass substrate to a thickness of 400 Å, thereby forming an anode including ITO and the Al-containing zinc oxide layer. An OLED was manufactured in the same manner as in Comparative Example 1, except that a first layer, instead of the HIL, was formed on the Al-containing zinc oxide layer to a thickness of 100 Å, wherein the first layer contained Compound 5 above and 1 part by weight of the compound of Formula 20A ($R_{109}$ is —F) based on 100 parts by weight of the first layer; and then the HTL was formed of Compound 5 thereon.

Formula 20A

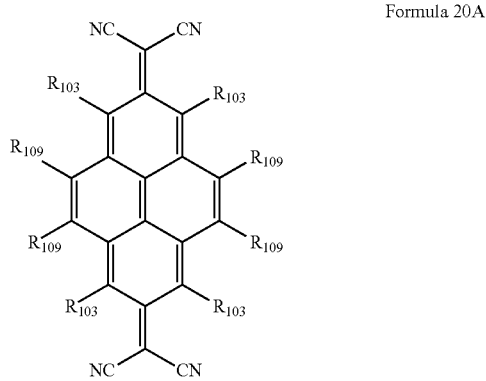

Example 2

An OLED was manufactured in the same manner as in Example 1, except that 3 parts by weight of the compound of Formula 20A was used based on 100 parts by weight of the first layer.

Evaluation Example

Driving voltages of the OLEDs manufactured in Comparative Example 1 and Examples 1 and 2 were measured using a 238 High-Current Source-Measure unit (available from Keithley Instruments Inc., Solon, Ohio), and current efficiency and power efficiency thereof were measured using a PR650 (Spectroscan) Source Measurement Unit. (available from PhotoResearch, Inc., Chatsworth, Calif.). The results are shown in Table 1 below.

TABLE 1

|  | Driving Voltage (V) | Current efficiency (Cd/A) | Power efficiency (lm/W) |
|---|---|---|---|
| Comparative Example 1 | 5.3 | 33.1 | 19.7 |
| Example 1 | 4.0 | 36.5 | 28.6 |
| Example 2 | 4.0 | 34.1 | 26.6 |

Referring to Table 1, it can be confirmed that the OLEDS of Examples 1 and 2 had lower driving voltages and higher current efficiency and power efficiencies as compared to the OLED of Comparative Example 1.

As described above, an OLED according to the present embodiments may have excellent driving voltage characteristics, emission efficiency characteristics and power efficiency characteristics.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. An organic light-emitting device comprising:
a substrate;
a first electrode disposed on the substrate;
a second electrode;
an organic layer disposed between the first electrode and the second electrode, the organic layer comprising an emission layer; and
at least one first layer disposed between the first electrode and the emission layer, the at least one first layer comprising a cyano group-containing compound and a hole transporting compound,
wherein the first electrode comprises a zinc oxide layer comprising at least one element selected from the group consisting of aluminum (Al), indium (In), gallium (Ga), germanium (Ge), gadolinium (Gd), zirconium (Zr), molybdenum (Mo), and nickel (Ni)
wherein the cyano group-containing compound comprises one of the compounds represented by Formulae 1 through 20:

Formula 1

Formula 2

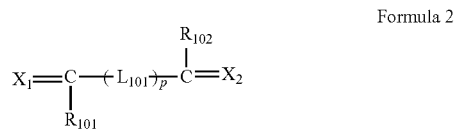

Formula 3

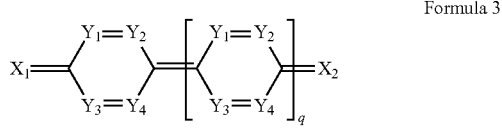

-continued
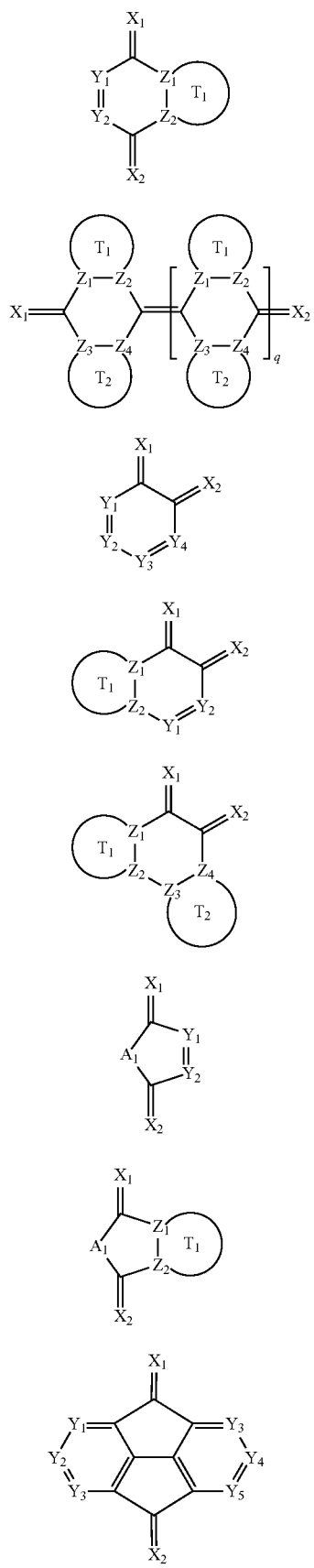
Formula 4
Formula 5
Formula 6
Formula 7
Formula 8
Formula 9
Formula 10
Formula 11
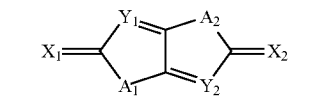
Formula 12
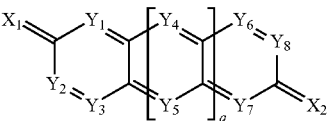
Formula 13
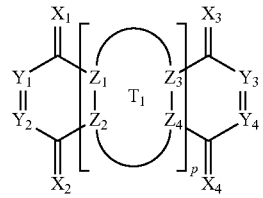
Formula 14
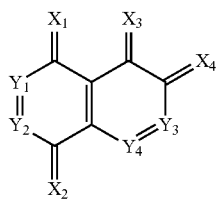
Formula 15
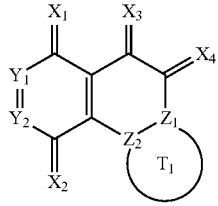
Formula 16
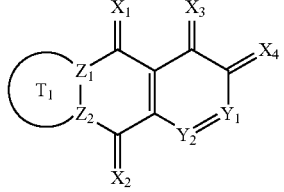
Formula 17
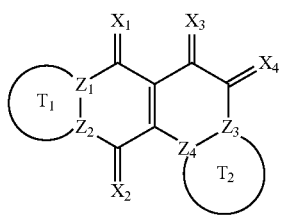
Formula 18
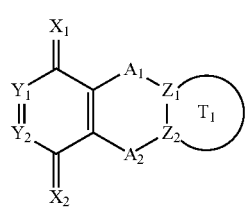
Formula 19

-continued

Formula 20

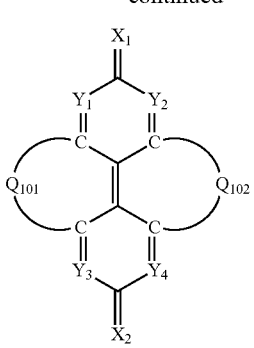

wherein:
$X_1$ through $X_4$ are each independently selected from the group consisting of compounds represented by Formulae 30A through 30D below;

Formula 30A

NC⌇CN
|
*

Formula 30B

NC⌇CF$_3$
|
*

Formula 30C

NC⌇NO$_3$
|
*

Formula 30D

N⌇CN
‖
* wherein $Y_1$ through $Y_8$ are each independently selected from the group consisting of N and $C(R_{103})$;
wherein $Z_1$ through $Z_4$ are each independently C or N;
$A_l$ and $A_2$ are each independently selected from the group consisting of —O—, —S—, —N($R_{104}$) and —C($R_{105}$)($R_{106}$)—;
wherein $Q_{101}$ and $Q_{102}$ are each independently selected from the group consisting of a $C_2$-$C_{10}$ alkylene group; a $C_2$-$C_{10}$ alkenylene group; and a substituted $C_2$-$C_{10}$ alkylene group and a substituted $C_2$-$C_{10}$ alkenylene group which have at least one substituent selected from the group consisting of a halogen atom, a cyano group, a hydroxyl group, a $C_1$-$C_{10}$ alkyl group and a $C_1$-$C_{10}$ alkoxy group;
wherein $T_1$ and $T_2$ are each independently selected from the group consisting of a $C_5$-$C_{30}$ aromatic ring system; a $C_3$-$C_{30}$ heteroaromatic ring system; a substituted $C_5$-$C_{30}$ aromatic ring system and a substituted $C_3$-$C_{30}$ heteroaromatic ring system which have at least one substituent selected from the group consisting of a halogen atom, a cyano group, a hydroxyl group, a $C_1$-$C_{10}$ alkyl group, and a $C_1$-$C_{10}$ alkoxy group;
wherein p is an integer from 1 to 10;
wherein q is an integer from 0 to 10;
wherein $R_{101}$ through $R_{106}$ are each independently selected from the group consisting of hydrogen; a halogen atom; a cyano group; a hydroxyl group; a $C_1$-$C_{10}$ alkyl group; a $C_1$-$C_{10}$ alkoxy group; a substituted $C_1$-$C_{10}$ alkyl group and a substituted $C_1$-$C_{10}$ alkoxy group which have at least one substituent selected from the group consisting of hydrogen, a halogen atom, a cyano group, a hydroxyl group, a $C_5$-$C_{14}$ aryl group, and a $C_3$-$C_{14}$ heteroaryl group;

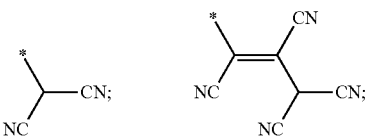 [SMILES: *C(C#N)C#N ; */C(C#N)=C(\C#N)C(C#N)C#N]

and —N($R_{107}$)($R_{108}$), wherein $R_{107}$ and $R_{108}$ are each independently selected from the group consisting of hydrogen, a $C_1$-$C_{10}$ alkyl group, a phenyl group and a biphenyl group; and
wherein $L_{101}$ is selected from the group consisting of a $C_5$-$C_{14}$ arylene group; a $C_5$-$C_{14}$ heteroarylene group; and a substituted $C_2$-$C_{10}$ alkenylene group, a substituted $C_5$-$C_{14}$ arylene group and a substituted $C_3$-$C_{14}$ heteroarylene group which have at least one substituent selected from the group consisting of a halogen atom, a cyano group, a hydroxyl group, a $C_1$-$C_{10}$ alkyl group and a $C_1$-$C_{10}$ alkoxy group;
wherein the hole transporting compound comprises a compound represented by Formula 41 or 42 below:

Formula 41

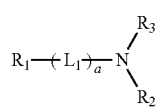

Formula 42

[structure with substituents $R_{10}$ through $R_{29}$, $L_{11}$, b, N]

wherein,
$R_{10}$ is represented by —(Ar$_1$)$_n$—Ar$_2$;
$R_{16}$ is represented by —(Ar$_{11}$)$_m$—Ar$_{12}$;
$L_1$ and $L_{11}$ are each independently selected from the group consisting of a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_3$-$C_{30}$ heteroarylene group, and —N(Q$_1$)—;
n, m, a and b are each independently an integr from 0 to 10;
$Ar_1$ and $Ar_{11}$ are each independently selected from the group consisting of a $C_1$-$C_{10}$ alkylene group; a phenylene group; a naphthylene group; an anthrylene group; a fluorenylene group; a carbazolylene group; a pyrazolylene group; a pyridinylene group; a triazinylene group; —N(Q$_1$)—; and a substituted $C_1$-$C_{10}$ alkylene group, a substituted phenylene group, a substituted naphthylene group, a substituted anthrylene group, a substituted fluorenylene group, a substituted carbazolylene group, a substituted pyrazolylene group, substituted pyridinylene group, and a substituted triazinylene group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group; and $Q_1$ is selected from the group consisting of hydrogen; a $C_1$-$C_{10}$ alkyl group; a phenyl group; a naphthyl group; a carbazolyl group; a fluorenyl group; and a substituted $C_1$-$C_{10}$ alkyl group, a substituted $C_1$-$C_{10}$ alkoxy group, a substituted phenyl group, a substituted naphthyl group, a substituted carbazolyl group, and a substituted fluorenyl group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group;

$R_1$ through $R_3$, $R_{11}$ through $R_{15}$, $R_{17}$, $R_{18}$, $R_{21}$ through $R_{29}$, $Ar_2$, and $Ar_{12}$ are each independently selected from the group consisting of hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ allynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a $C_3$-$C_{30}$ heteroaryl group, and —N($Q_2$)($Q_3$);

$Q_2$ and $Q_3$ are each independently selected from the group consisting of hydrogen, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ allynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, and a substituted or unsubstituted $C_3$-$C_{30}$ heteroaryl group; and wherein groups of $Ar_1$ in —$(Ar_1)_n$— are identical to or different from each other, groups of $Ar_{11}$ in —$(Ar_{11})_m$— are identical to or different from each other, groups of $L_1$ in -$(L_1)_a$- are identical to or different from each other, and groups of $L_{11}$ in -$(L_{11})_b$- are identical to or different from each other.

2. The organic light-emitting device of claim 1, wherein the first electrode further comprises a transparent conductive layer.

3. The organic light-emitting device of claim 2, wherein the amount of the first element is from about 0.5 to about 10 parts by weight based on 100 parts by weight of the first element-containing zinc oxide layer.

4. The organic light-emitting device of claim 2, further comprising at least one layer selected from the group consisting of a hole injection layer and a hole transport layer between the first layer and the emission layer.

5. The organic light-emitting device of claim 1, zinc oxide layer comprises aluminum (Al).

6. The organic light-emitting device of claim 1, wherein $X_1$ through $X_4$ are each independently selected from the compounds of Formula 30A or the compound of Formula 30D

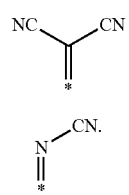

Formula 30A

Formula 30D

7. The organic light-emitting device of claim 1, wherein $R_{103}$ is selected from the group consisting of hydrogen; a halogen atom; a cyano group; a $C_1$-$C_{10}$ alkyl group; a $C_1$-$C_{10}$ alkoxy group; a substituted $C_1$-$C_{10}$ alkyl group and a substituted $C_1$-$C_{10}$ alkoxy group which have at least one substituent selected from the group consisting of a halogen atom, a cyano group, a phenyl group, a naphthyl group, an anthryl group, a pyridinyl group, a thiophenyl group, and a benzothiophenyl group; and —N($R_{107}$)($R_{108}$), wherein $R_{107}$ and $R_{108}$ are each independently selected from the group consisting of hydrogen, a $C_1$-$C_{10}$ alkyl group, a phenyl group, and a biphenyl group.

8. The organic light-emitting device of claim 1, wherein $T_1$ and $T_2$ are each independently selected from the group consisting of benzene; naphthalene; anthracene; thiophene; thiadiazole; oxadiazole; and a substituted benzene, a substituted naphthalene, a substituted anthracene, a substituted thiophene, a substituted thiadiazole and a substituted oxadiazole which have at least one substituent selected from the group consisting of a halogen atom, a cyano group, a $C_1$-$C_{10}$ alkyl group and a $C_1$-$C_{10}$ alkoxy group.

9. The organic light-emitting device of claim 1, wherein $L_{101}$ is selected from the group consisting of a thiophenylene group; a benzothiophenylene group; and a substituted thiophenylene group and a substituted benzothiophenylene group which have at least one substituent selected from the group consisting of a halogen atom, a cyano group and a $C_1$-$C_{10}$ alkyl group.

10. The organic light-emitting device of claim 1, wherein the cyano group-containing compound comprises one of the compounds represented by Formulae 1A through 20B below:

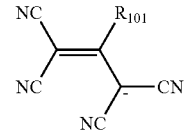

Formula 1A

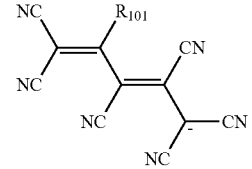

Formula 1B

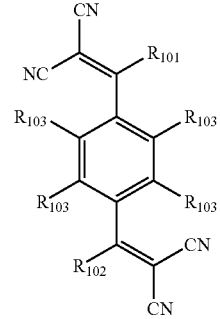

Formula 2A

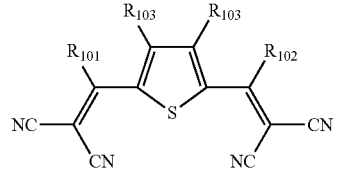

Formula 2B

-continued
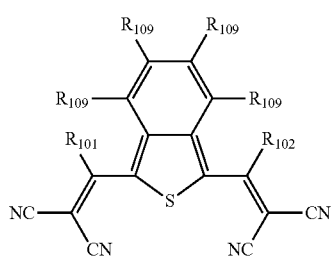
Formula 2C
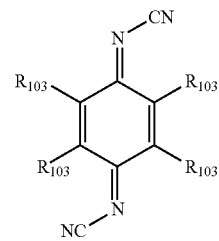
Formula 3A
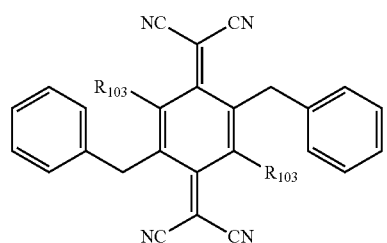
Formula 3B
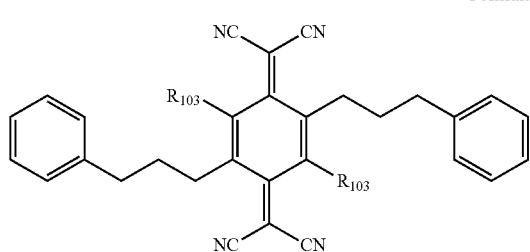
Formula 3C
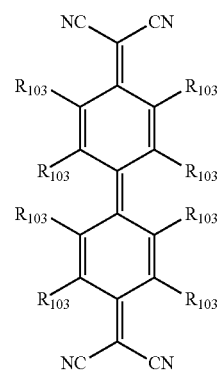
Formula 3D
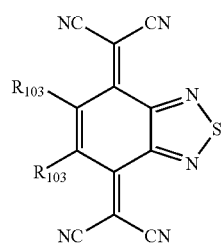
Formula 4A
-continued
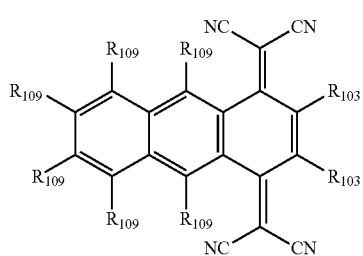
Formula 4B
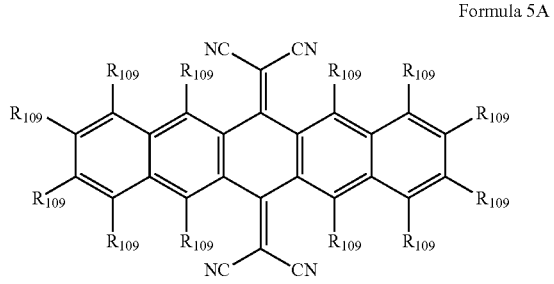
Formula 5A
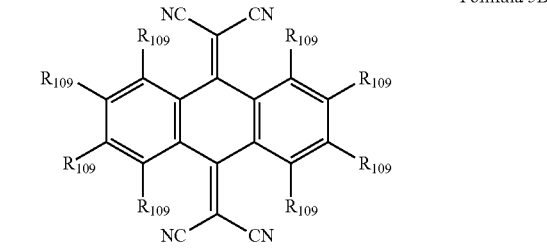
Formula 5B
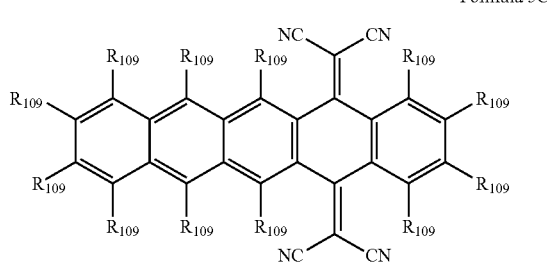
Formula 5C
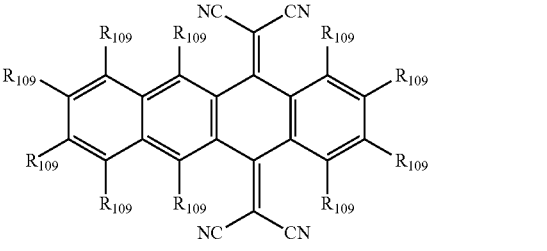
Formula 5D
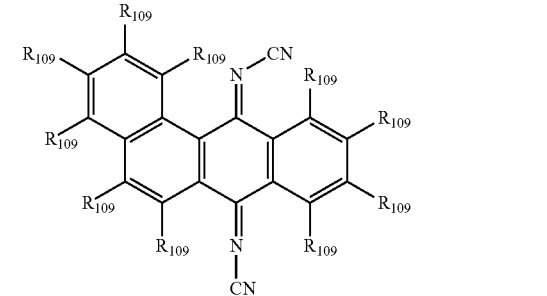
Formula 5E -continued
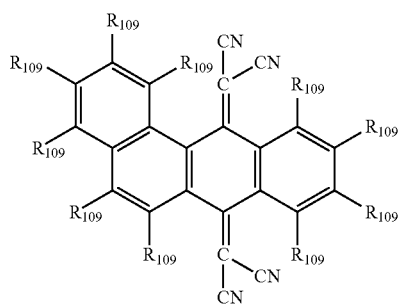
Formula 5F
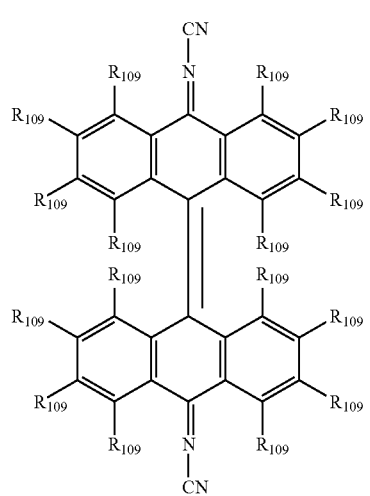
Formula 5G
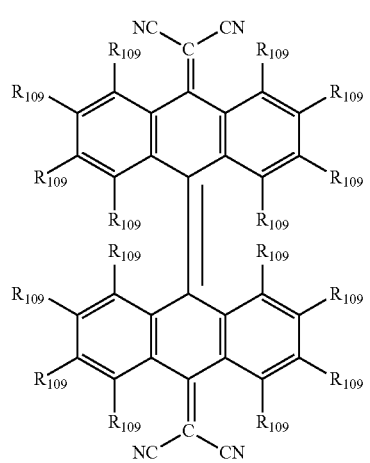
Formula 5H
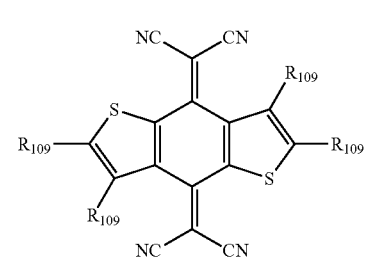
Formula 5I
-continued
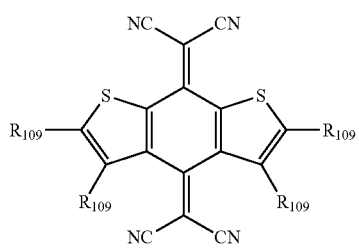
Formula 5J
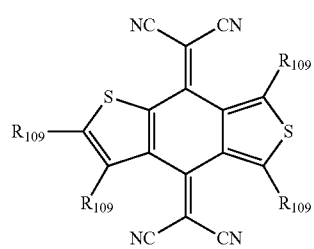
Formula 5K
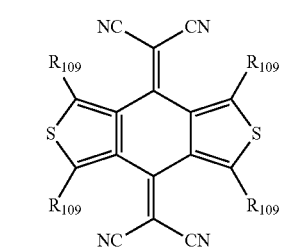
Formula 5L
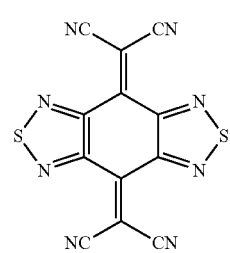
Formula 5M
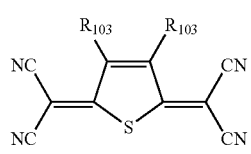
Formula 9A
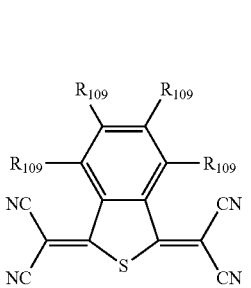
Formula 10A

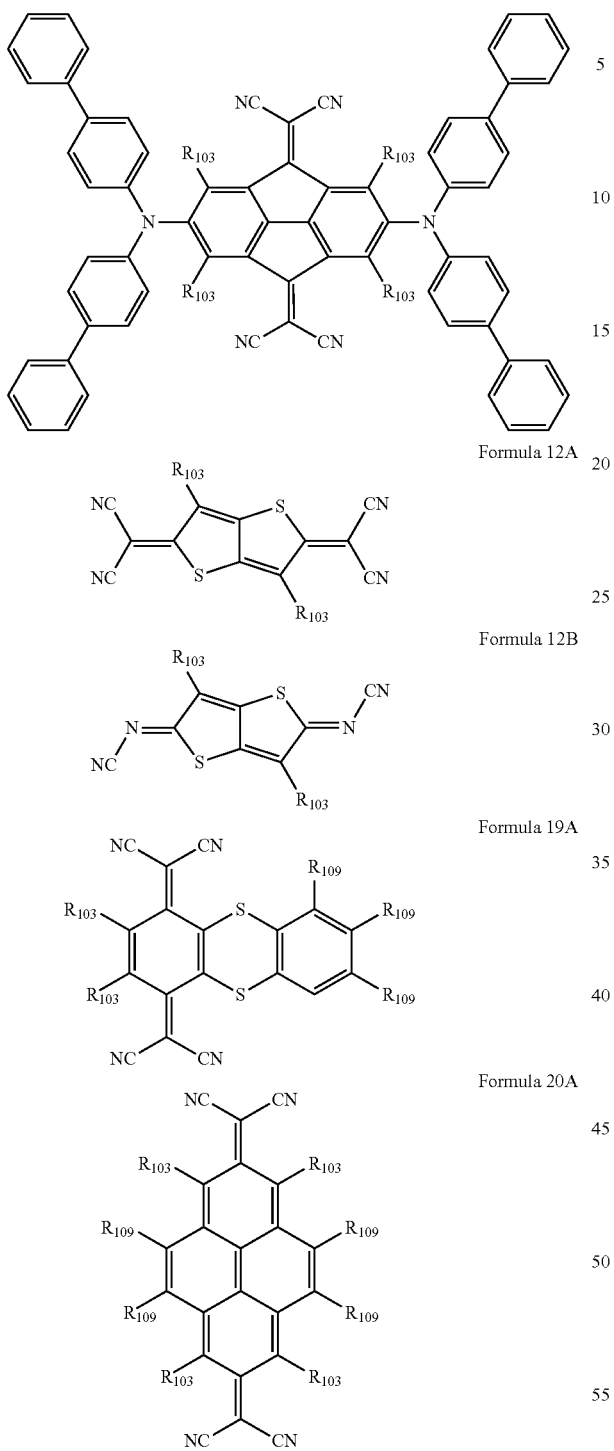

Formula 11A

Formula 12A

Formula 12B

Formula 19A

Formula 20A

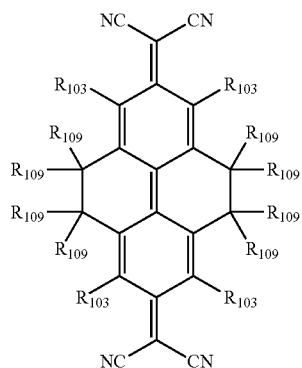

Formula 20B wherein $R_{103}$ and $R_{109}$ are each independently selected from the group consisting of hydrogen, —F, a cyano group, a methyl group, an ethyl group, a propyl group, a methoxy group, an ethoxy group, and a propoxy group.

11. The organic light-emitting device of claim 10, wherein the amount of the cyano group-containing compound in the first layer is from about 0.1 to about 20 parts by weight based on 100 parts by weight of the first layer.

12. The organic light-emitting device of claim 1, wherein $Ar_2$ and $Ar_{12}$ are each independently selected from the group consisting of hydrogen; a $C_1$-$C_{10}$ alkyl group; a phenyl group; a naphthyl group; a carbazolyl group; a fluorenyl group; a pyrenyl group; a substituted $C_1$-$C_{10}$ alkyl group, a substituted $C_1$-$C_{10}$ alkoxy group, a substituted phenyl group, a substituted naphthyl group, a substituted carbazolyl group, a substituted fluorenyl group and a substituted pyrenyl group which have at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group and an anthryl group; and —N($Q_2$)($Q_3$), wherein $Q_2$ and $Q_3$ are each independently selected from the group consisting of hydrogen, a methyl group, an ethyl group, a phenyl group, a methylphenyl group, a biphenyl group, a naphthyl group, and a methylnaphthyl group.

13. The organic light-emitting device of claim 1, wherein n and m are each independently 0, 1, 2, 3, 4, 5, or 6.

14. The organic light-emitting device of claim 1, wherein the first layer has a thickness of from about 10 Å to about 2,100 Å.

15. The organic light-emitting device of claim 1, wherein a distance between the first layer and the emission layer is about 50 Å or greater.

16. The organic light-emitting device of claim 1, further comprising at least one layer selected from the group consisting of a hole injection layer and a hole transport layer between the first layer and the emission layer.

* * * * *